US008017452B2

(12) United States Patent
Ishihara et al.

(10) Patent No.: US 8,017,452 B2
(45) Date of Patent: Sep. 13, 2011

(54) METHOD OF MANUFACTURING SEMICONDUCTOR DEVICE WITH ELECTRODE FOR EXTERNAL CONNECTION AND SEMICONDUCTOR DEVICE OBTAINED BY MEANS OF SAID METHOD

(75) Inventors: Masamichi Ishihara, Fukuoka (JP); Hirotaka Ueda, Kanagawa (JP)

(73) Assignee: Kyushu Institute of Technology, Fukuoka (JP)

( * ) Notice: Subject to any disclaimer, the term of this patent is extended or adjusted under 35 U.S.C. 154(b) by 253 days.

(21) Appl. No.: 12/259,329

(22) Filed: Oct. 28, 2008

(65) Prior Publication Data

US 2009/0050994 A1    Feb. 26, 2009

Related U.S. Application Data

(63) Continuation-in-part of application No. PCT/JP2007/072157, filed on Nov. 15, 2007.

(30) Foreign Application Priority Data

Nov. 28, 2006 (JP) ................................. 2006-320058

(51) Int. Cl.
*H01L 21/00* (2006.01)
(52) U.S. Cl. ........ 438/127; 438/584; 438/611; 257/687; 257/752; 257/E21.502

(58) Field of Classification Search .................. None
See application file for complete search history.

(56) References Cited

U.S. PATENT DOCUMENTS

| 7,556,983 B2 * | 7/2009 | Kurita | 438/108 |
| 7,678,612 B2 * | 3/2010 | Fujii et al. | 438/118 |
| 7,851,358 B2 * | 12/2010 | Wu et al. | 438/660 |
| 2003/0090883 A1 * | 5/2003 | Asahi et al. | 361/761 |
| 2004/0195691 A1 * | 10/2004 | Moriyasu et al. | 257/758 |
| 2005/0029642 A1 * | 2/2005 | Takaya et al. | 257/678 |
| 2005/0247665 A1 * | 11/2005 | Oi et al. | 216/13 |
| 2006/0121718 A1 * | 6/2006 | Machida et al. | 438/612 |

* cited by examiner

*Primary Examiner* — Thanh V Pham
*Assistant Examiner* — Andres Muñoz
(74) *Attorney, Agent, or Firm* — McGlew and Tuttle, P.C.

(57) ABSTRACT

A circuit element is disposed on an organic substrate and is connected to a wiring pattern provided on the organic substrate. Internal connection electrodes are formed on a support of a conductive material through electroforming such that the internal connection electrodes are integrally connected to the support. First ends of the internal connection electrodes integrally connected by the support are connected to the wiring pattern. After the circuit element is resin-sealed, the support is removed so as to separate the internal connection electrodes from one another. Second ends of the internal connection electrodes are used as external connection electrodes on the front face, and external connection electrodes on the back face are connected to the wiring pattern.

20 Claims, 31 Drawing Sheets

SUBSTRATE (SUPPORT PORTION) REMOVED

FIG. 29
PRIOR ART
(a) APPLICATION OF RESIST
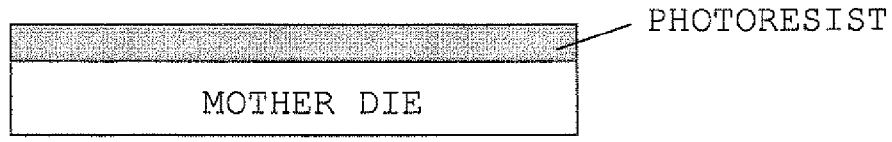
PHOTORESIST
MOTHER DIE
(b) PATTERNING
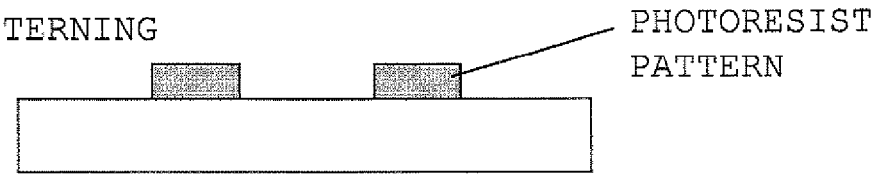
PHOTORESIST PATTERN
(C) PLATING
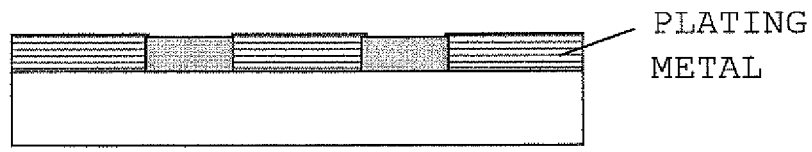
PLATING METAL
(d) FLATTENING
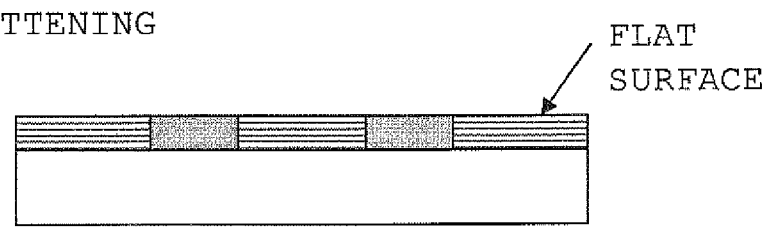
FLAT SURFACE
(e) REMOVAL OF RESIST
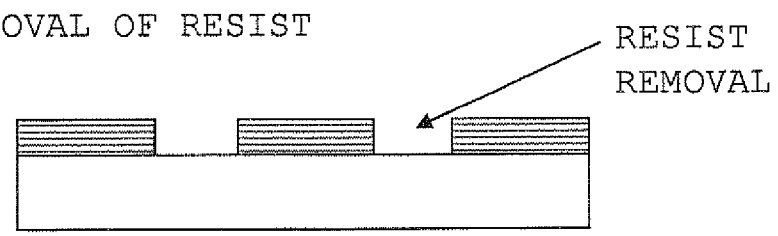
RESIST REMOVAL
(f) SEPARATION
INTERNAL CONNECTION ELECTRODE

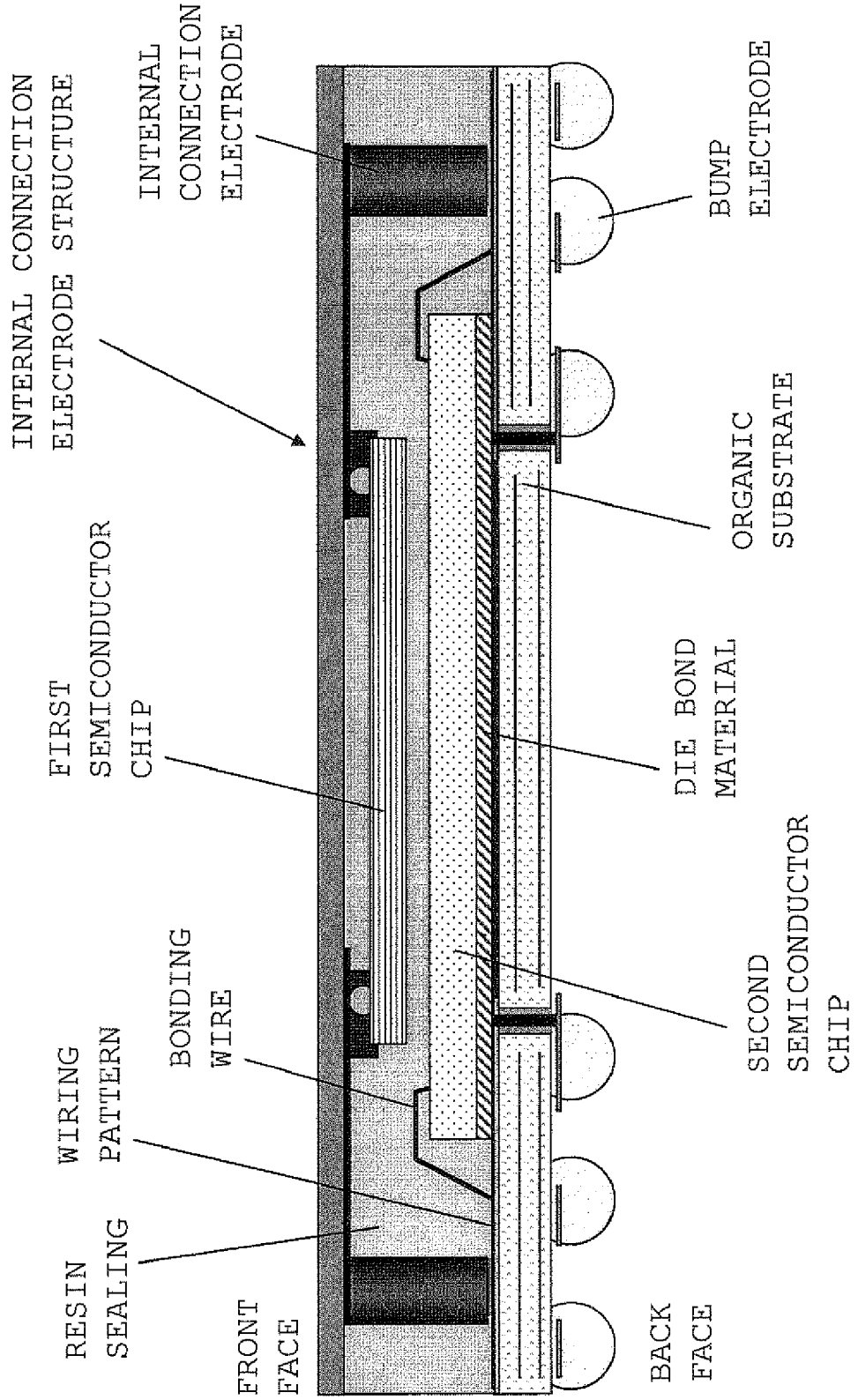

ENLARGED VIEW

CROSS-SECTIONAL VIEW OF Y-Y'

METHOD OF MANUFACTURING SEMICONDUCTOR DEVICE WITH ELECTRODE FOR EXTERNAL CONNECTION AND SEMICONDUCTOR DEVICE OBTAINED BY MEANS OF SAID METHOD

CROSS REFERENCE TO RELATED APPLICATIONS

This application is a continuation-in-part application of PCT/JP 2007/072157, filed on Nov. 15, 2007.

BACKGROUND OF THE INVENTION

1. Field of the Invention

The present invention relates to a method of manufacturing a semiconductor device having a double-sided electrode structure in which circuit elements including a semiconductor chip are disposed and resin-sealed, and electrodes for external connection (hereinafter referred to as "external connection electrodes") connected to the circuit elements are disposed on both front and back faces; to a method of manufacturing a semiconductor device in which a plurality of circuit elements are disposed, resin-sealed, and are internally connected, and external connection electrodes are to be connected to an outside circuit are disposed; and to semiconductor devices manufactured by these methods.

2. Description of the Related Art

In association with an increase in the degree of integration of LSI chips, there has been strong demand for a reduction in package size. Under the circumstances, various package structures have been proposed. In recent years, developments have been carried out intensively for stacking semiconductor bare chips through utilization of through electrodes formed therein. Meanwhile, double-sided packages of real chip size are also highly likely to be commercialized. Conventional double-sided packages of any technology require a through electrode structure (refer to Patent Document 1). Since existing methods for forming through electrodes involve low-temperature treatment so as to charge a low resistance metal, application of such methods to a semiconductor process is difficult. Further, since existing insulation methods for through holes in a semiconductor substrate involve high-temperature treatment, application of such insulation methods to a semiconductor packaging process is difficult. Formation of through electrodes in a semiconductor substrate and insulation for the through electrodes still involve problems to be solved; therefore, wiring that does not require through electrodes is desired.

Patent Document 2 discloses a double-sided electrode structure in which projecting electrodes are formed on a substrate; however, this document discloses neither a specific method of forming the projecting electrodes nor a specific connection method. Although Patent Document 2 discloses rewiring on the upper surface, this document merely discloses a conventional method of forming a low resistant metal film by means of upper surface plating, and forming a pattern by means of lithography. Such a conventional method has a considerable problem in terms of cost.

Patent document 3 discloses a technique which is used for a multilayer substrate for a stacked semiconductor package so as to reduce the thickness of a package of an individual single layer. For the thickness reduction, a lower wiring substrate and an upper wiring substrate are manufactured separately, and then bonded together. Although the upper wiring substrate simultaneously enables extension of electrodes to the upper surface and rewiring, its low cost manufacture is difficult.

Patent Document 4 discloses a technique used for a stacked semiconductor so as to form projecting electrodes of a package of an individual single layer thereof. The patter of the projecting electrodes is formed by use of a film; solder paste is charged into openings of the film; and the projecting electrodes are formed through application of heat. This technique requires a considerable complicated process, and increases cost.

In general, a sensor IC such an image sensor, a pressure sensor, or an acceleration sensor, is fabricated separately from a processing circuit LSI therefor. There is a demand for a semiconductor package in which a plurality of circuit elements such as a sensor IC and a processing circuit LSI chip are mounted in the package.

Patent Document 5 discloses a technique for integrating a plurality of circuits and elements by use of a double package; however, this document does not disclose a technique for integrating a plurality of circuits and elements within a single common package.

Patent Document 6 discloses a technique for attaching an imaging device chip of a digital camera; however, this document merely discloses a method of mounting a lens and an imaging device chip, and does not mention connection between the imaging device chip and a processing LSI.

Patent Document 7 discloses a technique for mounting chips on opposite faces of a single package substrate. FIG. 49 is a cross sectional view showing a sensor module described in Patent Document 7. An infrared-ray sensor chip is mounted on one face of the substrate, and a signal processing IC is bare-chip mounted on the other face. A positioning cover which covers the infrared-ray sensor chip and also serves as a filter is fixed to the substrate, and is fitted into a sensor light receiving window formed in a main board (not shown). The infrared-ray sensor chip and the substrate are connected together by means of bonding wires, and the signal processing IC and the substrate are connected together by means of bonding wires. The signal processing IC and the bonding wires connected thereto are protected by sealing resin.

As described above, the structure shown in FIG. 49 enables mounting of a plurality of elements to a single substrate. However, since both the faces of the substrate are used, a mounting process becomes complex, which increases cost. Further, since the opposite faces are covered by components, connection points which are used for attachment to the lens or the main board are present only in a peripheral area of the substrate, so the substrate has a problem of an increased area.

[Patent Document 1] Japanese Patent Application Laid-Open (kokai) No. 2001-127243
[Patent Document 2] Japanese Patent Application Laid-Open (kokai) No. 2002-158312
[Patent Document 3] Japanese Patent Application Laid-Open (kokai) No. 2005-286010
[Patent Document 4] Japanese Patent Application Laid-Open (kokai) No. 2003-218283
[Patent Document 5] Japanese Patent Application Laid-Open (kokai) No. H8-46881
[Patent Document 6] Japanese Patent Application Laid-Open (kokai) No. 2004-7499
[Patent Document 7] Japanese Patent Application Laid-Open (kokai) No. H7-326779

SUMMARY OF THE INVENTION

Problems to be Solved by the Invention

An object of the present invention is to solve the above-mentioned problems and to manufacture and supply a double-sided electrode package in a simple manner at low cost without requiring a through electrode technique. Thus, the present invention enables manufacture of an organic-substrate-type double-sided electrode package, a lead-frame-type double-sided electrode package, or a tape-substrate-type double-sided electrode package. In addition to conventional application to cellular phones, these packages can be applied to various types of sensors (sound sensors, magnetic sensors, pressure sensors, etc.).

Another object of the present invention is to provide a stack packaging technique for mounting a plurality of elements, such as a sensor element and a processing LSI thereof, in a common package, to thereby reducing the size and cost.

Means for Solving the Problems

The present invention provides a method of manufacturing a semiconductor device having a double-sided electrode structure, and a semiconductor device manufactured by the method. In the semiconductor device, a circuit element, including a semiconductor chip, is disposed and resin-sealed, and external connection electrodes connected to the circuit element are disposed on a front face and a back face of the semiconductor device. The circuit element is disposed on an organic substrate and is connected to a wiring pattern provided on the organic substrate. Internal connection electrodes are formed on a support of a conductive material through electroforming such that the internal connection electrodes are integrally connected to the support; and first ends of the internal connection electrodes integrally connected by the support are connected to the wiring pattern at predetermined positions. After a resin for covering the circuit element is charged for resin sealing, the support is removed so as to separate the internal connection electrodes from one another. Second ends of the internal connection electrodes are used as the external connection electrodes on the front face, and the external connection electrodes on the back face are connected to the wiring pattern via a conductor layer within the organic substrate.

The present invention provides another method of manufacturing a semiconductor device having a double-sided electrode structure, and a semiconductor device manufactured by the method. In the semiconductor device, a circuit element is disposed on a lead frame, and is connected to inner lead portions of the lead frame. Internal connection electrodes are formed on a support of a conductive material through electroforming such that the internal connection electrodes are integrally connected to the support; and first ends of the internal connection electrodes integrally connected by the support are connected to the lead frame at predetermined positions. After a resin for covering the circuit element is charged for resin sealing, the support is removed so as to separate the internal connection electrodes from one another. Second ends of the internal connection electrodes are used as the external connection electrodes on the front face, and outer lead portions of the lead frame are used as the external connection electrodes on the back face.

The present invention provides still another method of manufacturing a semiconductor device having a double-sided electrode structure, and a semiconductor device manufactured by the method. In the semiconductor device, a wiring pattern is formed on a first support of a conductive material through electroforming; a circuit element is disposed on the wiring pattern; and electrode terminals of the circuit element are electrically connected to the wiring pattern at predetermined positions. A plurality of internal connection electrodes are formed on a second support of a conductive material through electroforming such that the internal connection electrodes are integrally connected to the second support; first ends of the internal connection electrodes are connected to the wiring pattern at predetermined positions; and second ends of the internal connection electrodes are used as the external connection electrodes on the front face. After a resin for covering the circuit element is charged for resin sealing, the first and second supports are removed so as to separate the internal connection electrodes from one another. The external connection electrodes on the back face are provided on the wiring pattern.

The present invention provides still another method of manufacturing a semiconductor device having a double-sided electrode structure, and a semiconductor device manufactured by the method. In the semiconductor device, a wiring pattern is integrally formed along with a plurality of internal connection electrodes on a support of a conductive material through electroforming; a circuit element is disposed on the wiring pattern; and electrode terminals of the circuit element are electrically connected to the wiring pattern at predetermined positions. Ends of the internal connection electrodes are used as the external connection electrodes on the front face. After the circuit element is resin-sealed, the support is removed so as to separate the internal connection electrodes from one another. The external connection electrodes on the back face are provided on the wiring pattern.

A semiconductor device of the present invention is configured such that a plurality of semiconductor chips accommodated therein are electrically connected together and external connection electrodes are provided. The semiconductor device comprises a substrate having a wiring pattern on an upper surface thereof; an internal connection electrode structure including a support portion, a wiring pattern disposed on the support portion, a plurality of internal connection electrodes whose first ends are connected to the wiring pattern on the support portion, and a first semiconductor chip connected to the wiring pattern on the support portion; and a second semiconductor chip fixed to the substrate and is connected to the wiring pattern on the substrate. Second ends of the internal connection electrodes are connected to the wiring pattern on the substrate to thereby fix the internal connection electrode structure to the substrate. A resin is charged in a space between the substrate and the support portion. External connection electrodes which are connected to the wiring pattern on the substrate or the wiring pattern on the support portion are disposed on at least one of the front face and the back face.

The present invention provides still another method of manufacturing a semiconductor device. In the method, a wiring pattern is formed on an upper surface of a substrate, and an internal connection electrode structure is formed such that a wiring pattern is disposed on a support portion, first ends of a plurality of internal connection electrodes are connected to the wiring pattern on the support portion, and a first semiconductor chip is connected to the wiring pattern on the support portion. A second semiconductor chip is fixed to the substrate and is connected to the wiring pattern on the substrate. Second ends of the internal connection electrodes are connected to the wiring pattern on the substrate to thereby fix the internal connection electrode structure to the substrate. A resin is charged in a space between the substrate and the support portion. External connection electrodes which are connected to the wiring pattern on the substrate or the wiring pattern on the support portion are disposed on at least one of the front face and the back face.

Effects of the Invention

According to the present invention, the internal connection electrode structure of a double-sided electrode package can be realized simply and at low cost, without requiring a through electrode technique. Thus, the double-sided electrode package can be effectively used in the field of compact mounting of electronic equipment to a cellular phone or the like, and effectively used as a package for a sensor whose three-dimensional connection is effective in the electronic equipment.

Further, according to the present invention, it becomes possible to extend an arbitrary number of wiring lines to arbitrary locations on the upper and lower portions of a substrate, to enable rewiring to be freely performed on the upper surface of the substrate, to thereby impart flexibility to the pattern of connection with an upper side IC.

Moreover, the present invention utilizes the characteristics of a pattern plated on an electroforming mother die of stain steel or the like such that the pattern can easily be removed through application of heat and pressure. Thus, the present invention enables the electroforming mother die to be removed without performing an upper surface grading process after resin sealing. Thus, an inexpensive double-sided electrode package can be realized. Further, when a rewiring pattern is formed on a stainless steel plate together with internal connection electrodes, a double-sided electrode package having rewiring on the upper surface thereof can be simply realized without new rewiring.

Conventionally, formation of internal connection electrodes and wiring are performed in different processes, resulting in an increase in the number of steps, and an increase in cost. For example, conventionally, internal connection electrodes are formed as follows. Holes are formed after resin sealing, and a metal is charged into the holes through plating. In a wiring process, through sputtering or vapor deposition, a metal film is uniformly applied onto metal surfaces exposed to the upper surface, and in a subsequent lithography process, wiring is formed through patterning. Such a method requires complicated processes, and requires processes different from a conventional assembly process, whereby cost tends to increase. In contrast, continuously performing formation of internal connection electrodes and wiring means that these processes are combined into a single process of forming a component including internal connection electrodes and wiring, and in the assembly process, all the conventional processes become unnecessary, whereby cost can be lowered. Further, when a company specialized in manufacture of components manufactures such a component, rationalization through specialization becomes possible, and the processes become simple as a whole, and cost can be lowered.

Further, according to the present invention, a plurality of elements, such as a sensor element and a processing LSI therefor, can be mounted in a common package, to thereby reduce the size and cost. Thus, it becomes possible to provide a thin image sensor module in which an image sensor and a signal processing IC are integrally mounted, or a camera module to which a lens therefor is attached.

BRIEF DESCRIPTION OF THE DRAWINGS

FIG. 29 is a set of process charts showing a method of manufacturing an electroformed component by use of photoresist.

FIG. 31 is a sectional view showing a fifth example of a semiconductor device of the present invention in which single-sided electrodes for external connection are disposed.

DETAILED DESCRIPTION OF THE PREFERRED EMBODIMENTS

Figure 1:
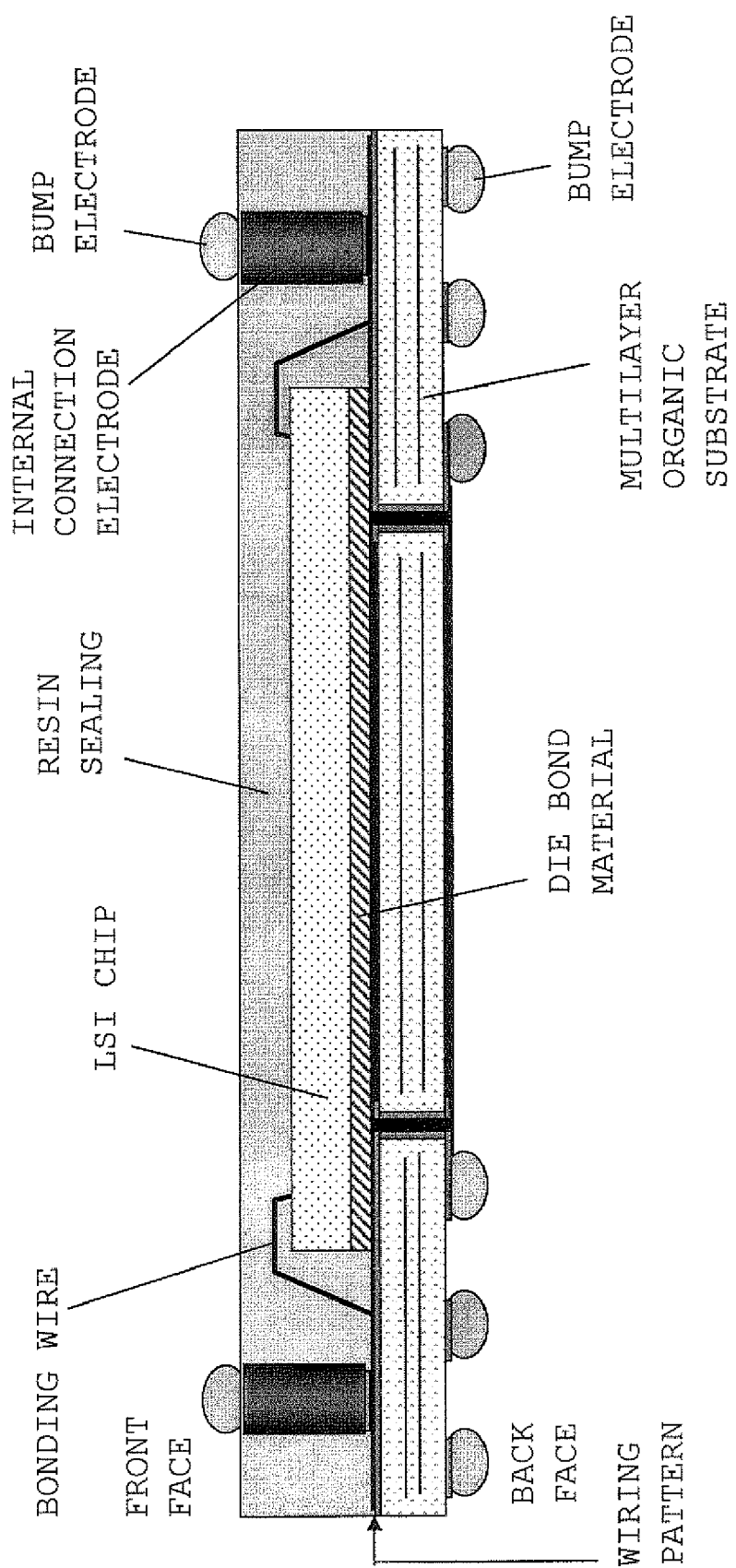
FIG. 1 is a cross sectional view of an organic-substrate-type double-sided electrode package showing a first example of a semiconductor device having a double-sided electrode structure of the present invention.

FIG. 1 shows a cross sectional view of an organic-substrate-type double-sided electrode package showing a first example of a semiconductor device having a double-sided electrode structure of the present invention. As shown in FIG. 1, the organic substrate side of the organic-substrate-type double-sided electrode package will be referred to as the back face, and the side on which a circuit element is disposed on the substrate will be referred to as the front face. A semiconductor chip, such as an LSI chip, is bonded to the multilayer organic substrate by use of a die bond material, and is connected to a wiring pattern of the uppermost layer of the organic substrate by use of bonding wires (wire bond connection scheme). Internal connection electrodes which are formed through electroforming and which are a feature of the present invention are fixed to and electrically connected to the wiring pattern of the organic substrate. The details of manufacture and connection of the internal connection electrodes will be described later. The upper surface of the organic substrate is sealed with resin so as to cover the LSI chip and the bonding wires. Bump electrodes for external connection (hereinafter referred to as "external connection bump electrodes") are formed on the upper surfaces of the internal connection electrodes and end surface electrode portions formed on the back face side.

Figure 2:
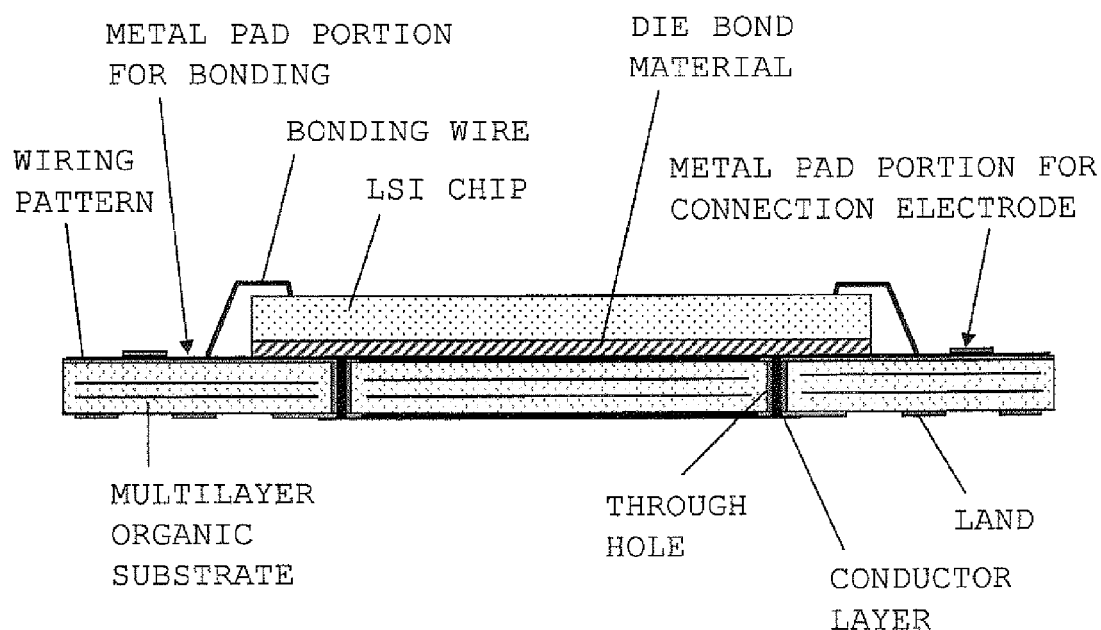
FIG. 2 is a view showing a state in which an LSI chip is bonded onto a multilayer organic substrate and is connected thereto.

Next, a process of manufacturing the semiconductor device having a double-sided electrode structure (the organic-substrate-type double-sided electrode package) shown in FIG. 1 will be described step by step with reference to FIGS. 2 to 6. FIG. 2 is a view showing a state in which an LSI chip is bonded onto a multilayer organic substrate and is connected thereto. FIG. 2 exemplifies a case where the LSI chip is bonded to the multilayer organic substrate by use of a die bond material, and is connected to a wiring pattern of the uppermost layer of the organic substrate by use of bonding wires. Metal pad portions for bonding, which serve as bonding wire connection electrodes, are formed on the wiring pattern of the uppermost layer of a multilayer or single-layer organic substrate, and wiring extending to the pad portions is formed. The metal pad portions on the front face of the multilayer or single-layer organic substrate and the LSI chip are connected together by means of Au bonding wires. In the illustrated example, a single LSI chip is disposed; however, a plurality of chips can be stacked.

Alternatively, the LSI chip can be flip-chip-bond connected to the organic substrate (not shown). In this case, the LSI chip is flip-chip-bond connected to the wiring pattern of the uppermost layer of the multilayer or single-layer organic substrate by use of an ordinary technique.

The single-layer organic substrate may have a single-layer or double-layer wiring structure, and the multilayer organic substrate may formed by forming a wiring pattern on each of a plurality of layers, bonding these layers together, and optionally forming through holes for connecting the wiring pattern of the layers. Conductor layers are formed in the through holes, and connected to lands formed on the back face side and serving as end surface electrode portions. That is, the conductor layers of the through holes do not necessarily serve as lands as they are. Further, a solder material is applied to the lands, whereby external connection bump electrodes can be formed. Such a multilayer or single-layer organic substrate is known as a batch-molded organic substrate (BGA: Ball Grid Array) in which small balls (bumps) made of a solder material, which are called "solder balls," are attached to the back face.

Figure 3:
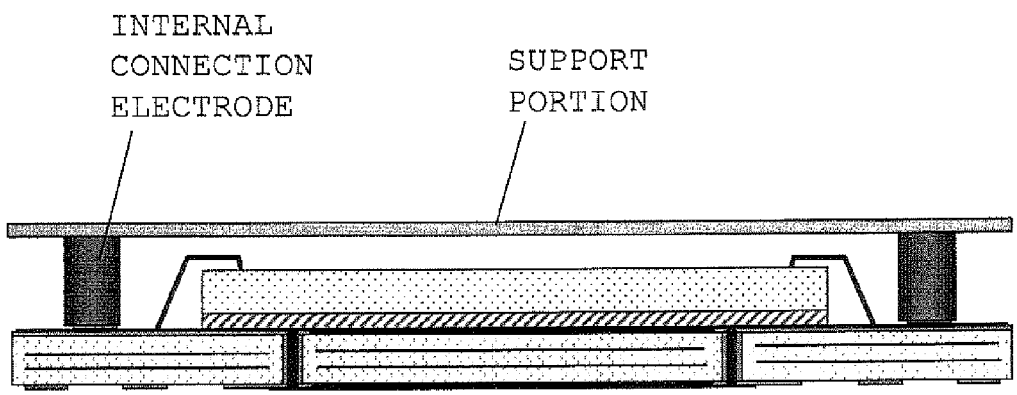
FIG. 3 is a view showing a state in which internal connection electrodes are fixed to the multilayer organic substrate and are connected thereto.

FIG. 3 is a view showing a state in which internal connection electrodes are fixed to the multilayer organic substrate and are connected thereto. The internal connection electrodes, which are the feature of the present invention, are fixed to and electrically connected to the wiring pattern of the organic substrate at predetermined locations. Although various connection methods, such as joining by means of ultrasonic waves and connection by use of conductive paste such as silver paste, can be used for fixing and connecting the internal connection electrodes, solder connection is preferred. Fixation and electrical connection can be performed easily during manufacture of the device.

In a state where the internal connection electrodes have been fixed to metal pad portions for connection electrodes (FIG. 2) provided on the wiring pattern of the organic substrate at predetermined locations, all the internal connection electrodes are integrally connected by a plate-shaped support portion.

Figure 4A:
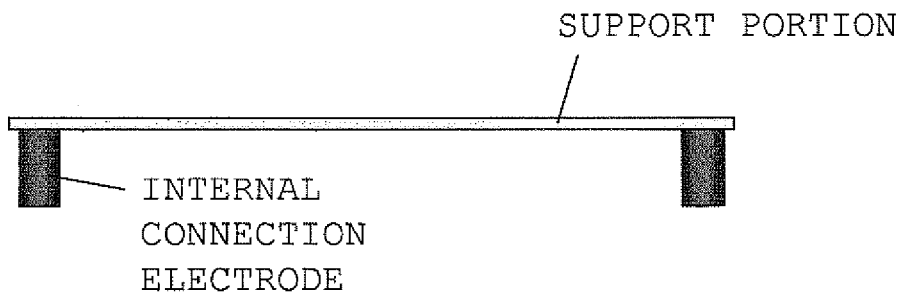
FIG. 4 is a set of views showing the details of an internal connection electrode structure in which internal connection electrode are integrally connected by a plate-shaped support portion.
Figure 4B:
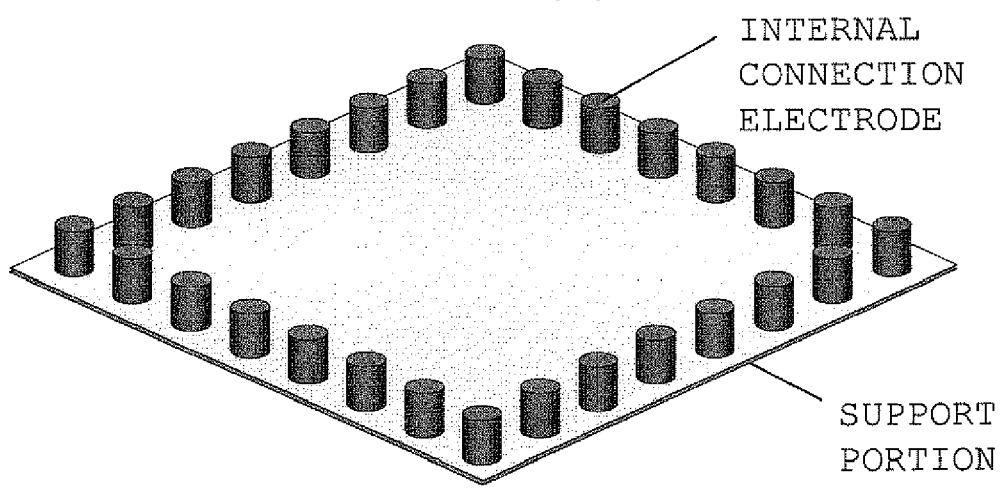
Figure 4C:
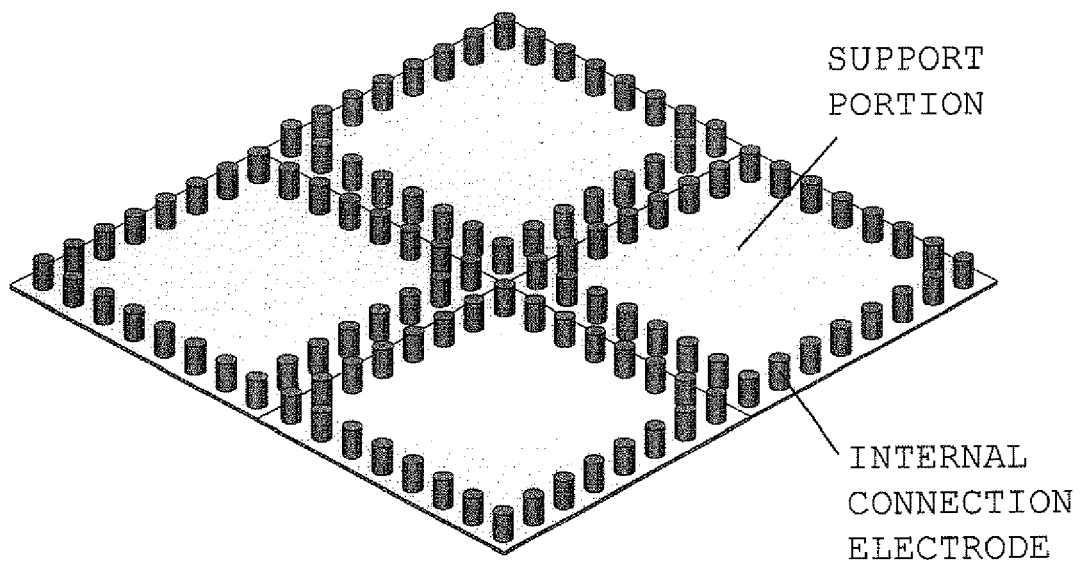

FIG. 4 is a set of views showing the details of an internal connection electrode structure in which the internal connection electrode are integrally connected by the plate-shaped support portion. FIGS. 4(A) and 4(B) show side sectional and perspective views of a unit structure for a single double-sided electrode package; and FIG. 4(C) shows a perspective view of a structure for four double-sided electrode packages, the structure being formed by connecting four unit structures. These unit structure and connected structure are formed by connecting a plurality of internal connection electrodes by a support portion. The shape of the internal connection electrodes is not limited to the illustrated circular columnar shape, and the internal connection electrodes may have any of other columnar (bar-like) shapes such as a rectangular columnar shape and a polygonal columnar shape. In the illustrated example, the central plate-shaped portion of the structure has no cutout; however, the central plate-shaped portion may have a cutout. The integrally connected internal connection electrodes are manufactured through electroforming.

Electroforming itself is well known. Electroforming is a "method of manufacturing, repairing, or replicating a metal product through electroplating," and is basically the same as electroplating. However, electroforming differs from electroplating in plating thickness, and also differs from electroplating in that an operation of separating a plating film is performed. Further, when a plating film is separated from a mother die and used, control and management of the physical properties of the plating film are important. A material including nickel, copper, a nickel alloy, or a copper alloy can be used in the present invention as a plating metal (conductive material) to be deposited by electroforming. Stainless steel, which a conductive material generally used for electroformed lead frames, can be used as the material of the mother die. Alternatively, the mother die may be formed of a material composed of a base and a film covering the base. The base is formed of, for example, copper which does not greatly differ in coefficient of thermal expansion from a resin material used for resin sealing. The base is covered by, for example, a thin oxide film which allows passage of electricity for plating therethrough and which facilitates separation of a plating pattern. The composition of a plating bath and plating conditions must be selected such that no internal stress is produced. In the case of nickel plating, nickel sulfamate bath is used as a plating bath.

Figure 30:
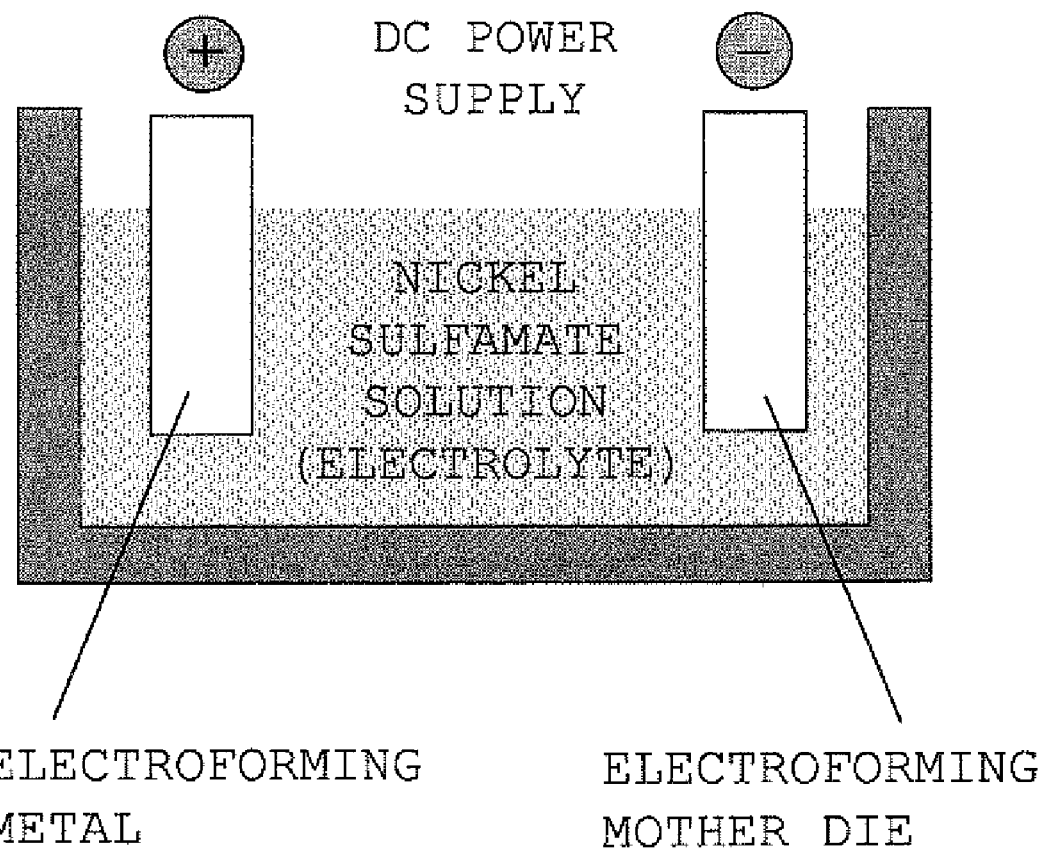
FIG. 30 is a view exemplifying a plating apparatus.

FIG. 29 is a set of process charts showing a method of manufacturing an electroformed component by use of photoresist. As shown in FIG. 29(a), photoresist (non-conductive film) is applied to an upper surface of a mother die of, for example, stainless steel. Subsequently, the photoresist is exposed to light through a pattern film to thereby form a pattern, followed by development, whereby an original plate for electroforming is formed (FIG. 29(b)). In the original plate, non-plating portions are covered by the photoresist pattern. The photoresist pattern of the original plate for electroforming has a thickness greater than that of a product (the internal connection electrodes or wiring pattern shown in FIG. 9). In the case of the internal connection electrodes, the photoresist pattern has a thickness greater than the thickness of a resin-sealed semiconductor chip or the total thickness of a plurality of stacked chips; for example, a thickness of about 100 mm to 300 mm. Subsequently, a plating metal is deposited in opening portions of the photoresist pattern (FIG. 29(c)). This is performed by use of a plating apparatus shown in FIG. 30. An anode and a cathode are placed in a plating bath (e.g., nickel sulfamate solution) maintained at a proper temperature. The anode is formed of an electroforming metal to be deposited through electroforming. The cathode is an electroforming mother die of, for example, stainless steel. As shown in FIG. 29(c), a photoresist pattern is previously formed on the surface of the electroforming mother die serving as the cathode. When a current is caused to flow between the anode and the cathode, the electroforming metal of the anode melts, and is plated in the opening portions of the photoresist pattern on the electroforming mother die.

Next, as shown in FIG. 29(d), flattening machining is performed. The plating metal corresponds to the internal connection electrodes (see FIG. 4). Further, a wiring pattern (see FIG. 9) can be formed by repeating the above-described process (FIGS. 29(a) to 29(d)) two times. That is, after formation of the wiring pattern in the first process, the internal connection electrodes to be connected to the wiring pattern are formed in the second process.

Next, the resist is removed (FIG. 29(e)), whereby the plating metal forms internal connection electrodes or a wiring pattern. The internal connection electrodes formed by the plating metal are then separated from the electroforming mother die (FIG. 29(f)). As will be described later, in the present invention, this separation process is performed after a resin sealing step (see FIG. 6). The feature of electroforming is that separation of the formed internal connection electrodes and support portion can be readily performed by means of heat and pressure.

Figure 5:
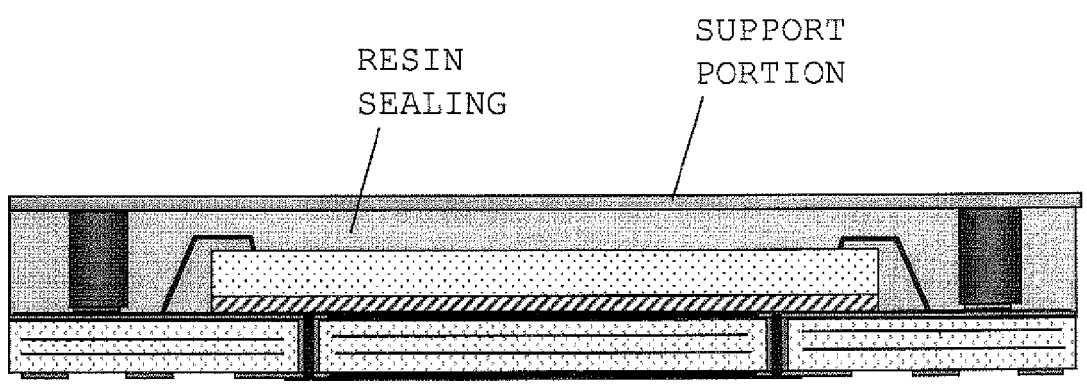
FIG. 5 is a view showing a state after resin sealing has been performed.

FIG. 5 is a view showing a state after resin sealing has been performed. After the internal connection electrodes connected together are fixed, in this state, the upper surface of the organic substrate is transfer-molded up to the lower surface of the support portion (the above-described electroforming mother die), or resin-sealed by use of a liquid resin (e.g., epoxy resin).

Figure 6:
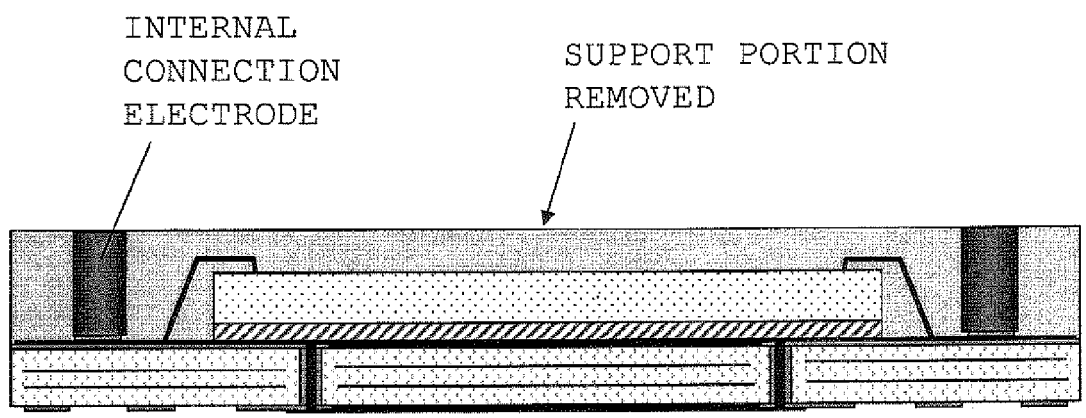
FIG. 6 is a view showing a state after the support portion has been removed.
Figure 7:
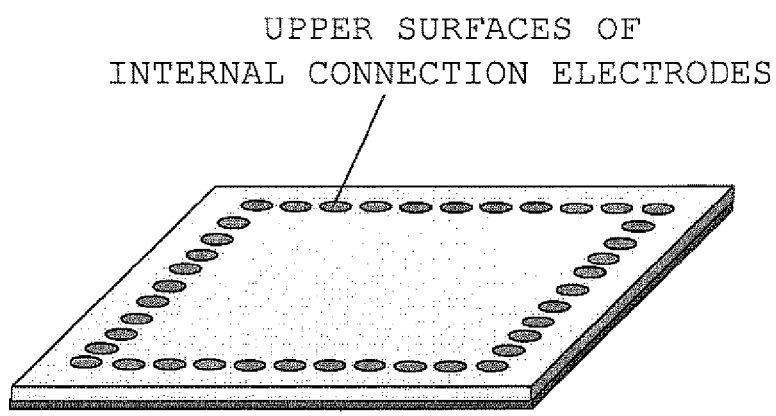
FIG. 7 is a view showing a state in which upper surfaces of the internal connection electrodes are exposed.

FIG. 6 is a view showing a state after the support portion (the electroforming mother die) has been removed. Upon removal of the support portion, the internal connection electrodes are electrically separated from one another. FIG. 7 is a top view showing a state in which the upper surfaces of the internal connection electrodes are exposed. The structure obtained in this stage can be used as a completed product. However, as having been described with reference to FIG. 1, external connection bump electrodes may be formed on the upper surfaces of the internal connection electrodes and the end surface electrode portions (lands) formed on the back face side.

As described above, columnar electrode posts (internal connection electrodes) are formed on the conductive material (the electroforming mother die), which serves as a support, by use of lithography and plating, whereby an internal connection electrode structure including the electrode posts integrated with the support is formed. This structure is connected to a multilayer substrate carrying an LSI chip, and a resin is charged into a space between the support and the multilayer substrate. After that, the support is removed, whereby a semiconductor device having a double-sided electrode structure is formed such that the end surfaces of the internal connection electrodes are connected to bump electrodes.

Figure 8:
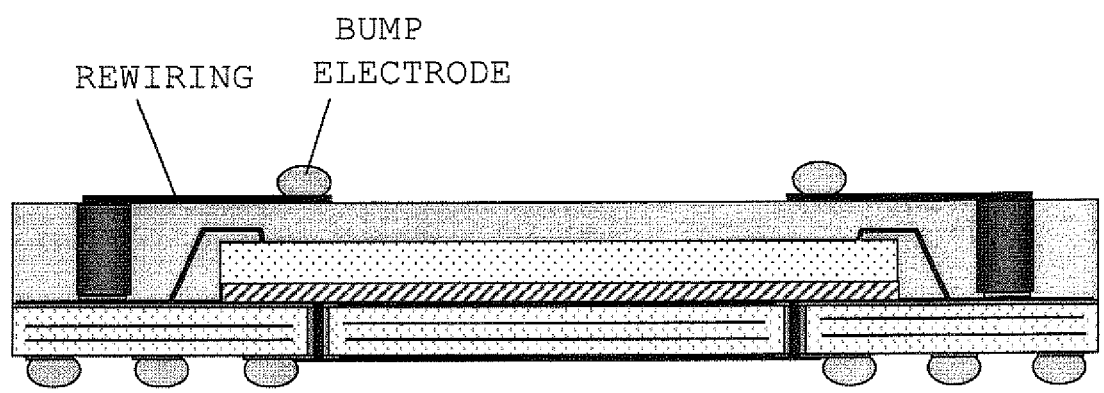
FIG. 8 is a view used for describing rewiring.

FIG. 8 is a view used for describing rewiring. Rewiring can be performed on the upper surface of the resin seal after the support portion removal process shown in FIG. 6. Rewiring is performed by means of ink-jet printing or screen printing in order to form wiring extending from the positions of the internal connection electrodes to another positions for an area arrangement. Alternatively, for rewiring on the upper surface, electroless plating may be performed after formation of a seed layer pattern. Further, in the case where copper particles are used for rewiring, in order to remove oxide films of the copper particles, reduction processing may be performed by use of atomic hydrogen. These methods enable bump electrodes to be disposed at locations different from the locations at which the head portions of the internal connection electrodes are exposed.

Figure 9A:
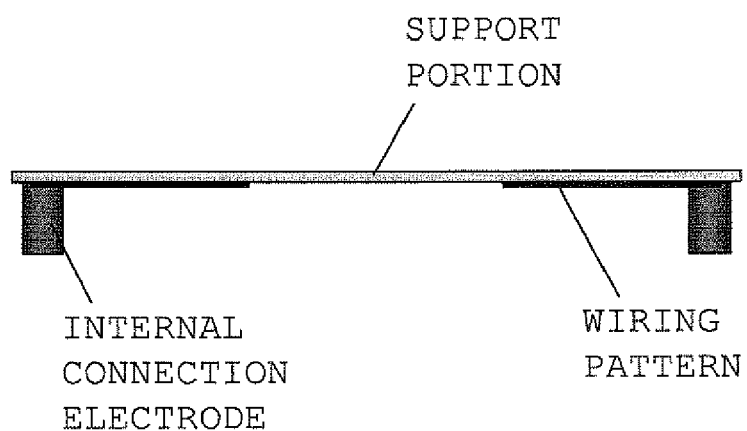
FIG. 9 is a pair of views showing an another example of an internal connection electrode structure differing from that of FIG. 4.
Figure 9B:
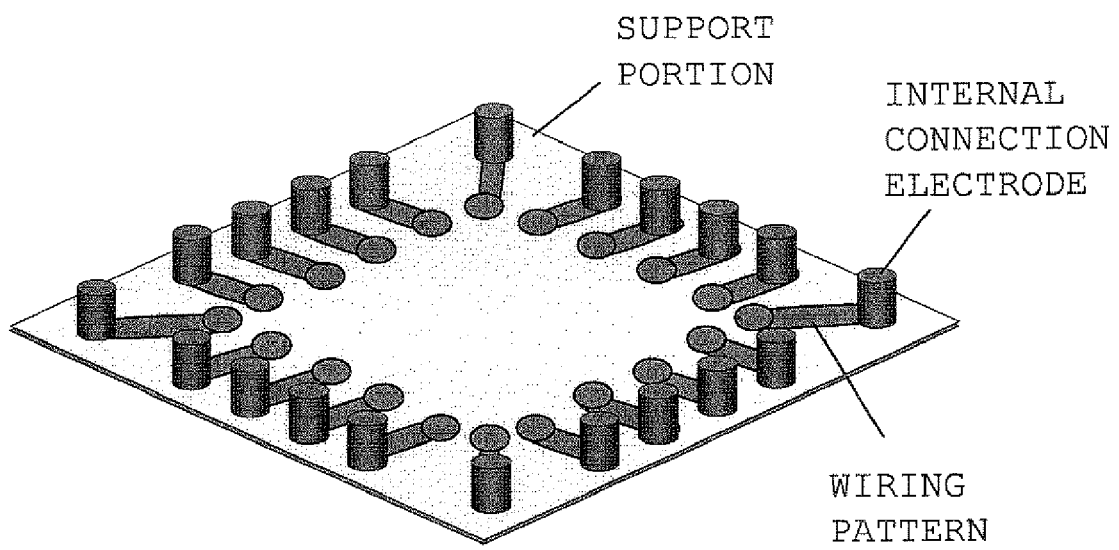

FIGS. 9 to 13 are views used for describing rewiring methods differing from that shown in FIG. 8. FIG. 9 is a view showing an another example of an internal connection electrode structure differing from that of FIG. 4. FIGS. 9(A) and 9(B) are side sectional and perspective views of a unit structure. As having been described with reference to FIG. 29, electroforming makes it possible to form not only the internal connection electrodes supported by the support portion but also the wiring pattern connected thereto. By such a method, an upper surface wiring pattern is incorporated into the internal connection electrode structure shown in FIG. 9. Notably, the illustrated internal connection electrode structure is a unit structure; however, the internal connection electrode structure may be a connected structure obtained by connecting a plurality of unit structures as shown in FIG. 4.

After an LSI chip is bonded and connected to the multilayer organic substrate (see FIG. 2), the internal connection electrodes supported by the support portion are fixed to and electrically connected to the organic substrate. At that time, an internal connection electrode structure as shown in FIG. 9; i.e., an internal connection electrode structure including a wiring pattern along with internal connection electrodes is used.

Figure 10:
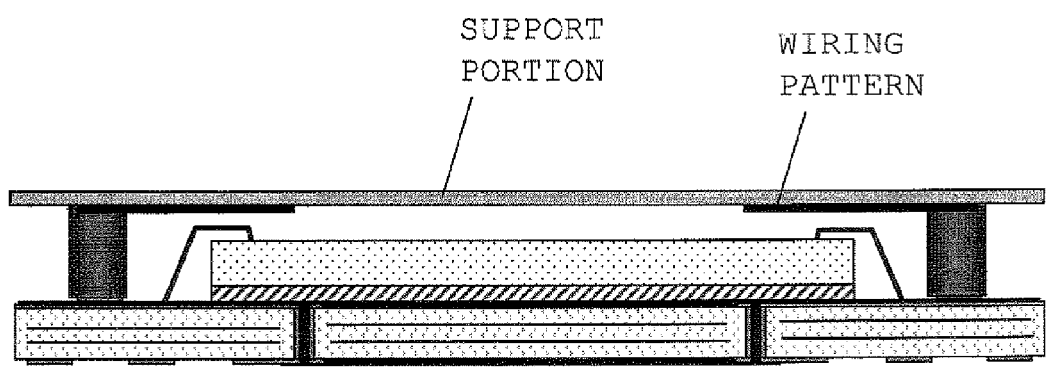
FIG. 10 is a view showing a state in which the internal connection electrode structure is fixed to a multilayer organic substrate and is connected thereto.

FIG. 10 is a view showing a state in which the internal connection electrode structure is fixed to the multilayer organic substrate and is connected thereto. As having been described with reference to FIG. 3, the internal connection electrodes integrally connected by the plate-shaped support portion are fixed to and electrically connected to the wiring pattern of the organic substrate at predetermined positions.

Figure 11:
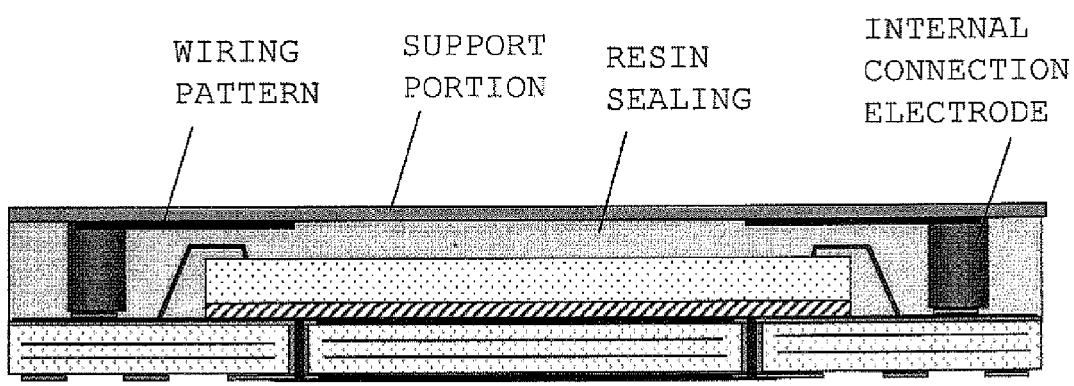
FIG. 11 is a view showing a state after resin sealing has been performed.
Figure 12:
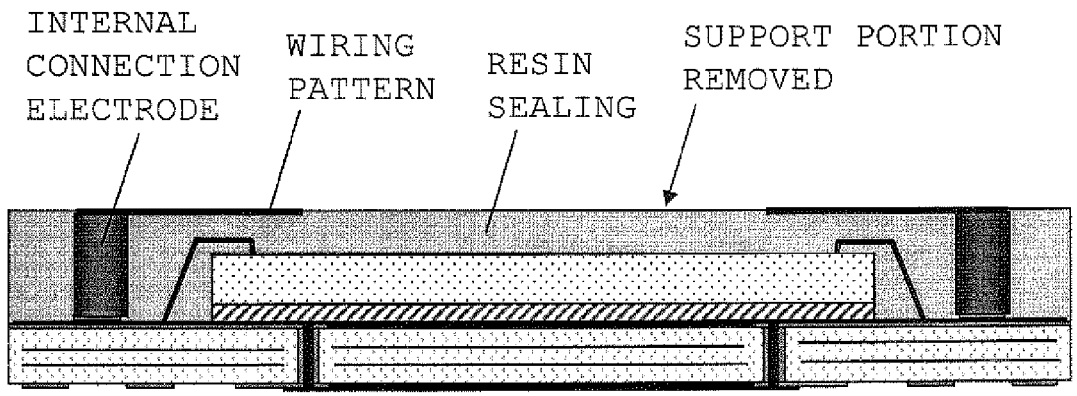
FIG. 12 is a view showing a state after a support portion has been removed.
Figure 13:
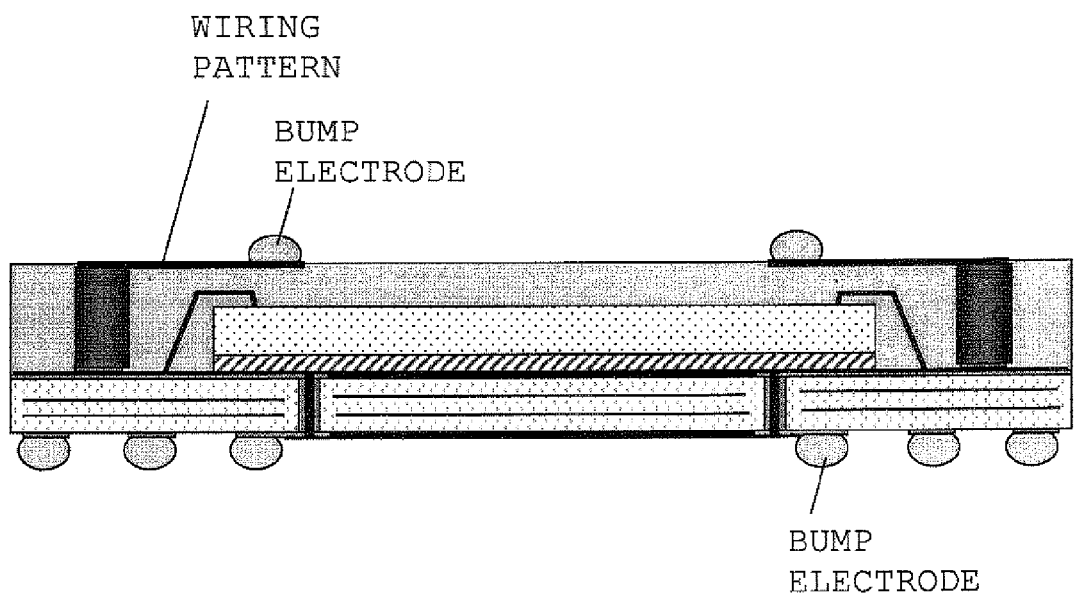
FIG. 13 is a view showing a completed state after bump electrodes for external connections have been formed.

FIG. 11 is a view showing a state after resin sealing has been performed. This state is similar to the state having been described with reference to FIG. 5. After that, the support portion is removed as shown in FIG. 12. FIG. 12 is a view showing a state after the support portion has been removed. Upon removal of the support portion, the internal connection electrodes and the wiring pattern connected thereto are electrically separated from one another. As a result, the wiring pattern is embedded in the front face of the resin seal such that the wiring pattern is flush with the surface of the charged resin. After that, insulating treatment is performed for the wiring portion if necessary, and, as shown in FIG. 13, external connection bump electrodes are formed on distal ends of the wiring pattern and lands formed on the back face side. Further, dicing is performed to obtain separated chips, which are completed products.

Figure 14:
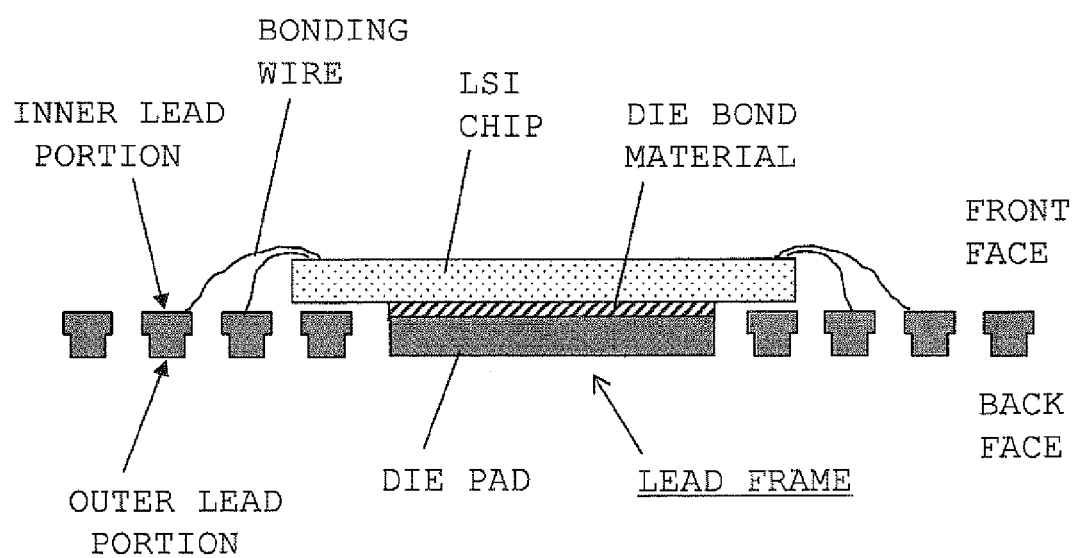
FIG. 14 is a view showing a state in which an LSI chip is bonded onto a lead frame and is connected thereto.

Next, with reference to FIGS. 14 to 17, there will be described a lead-frame-type double-sided electrode package showing a second example of a semiconductor device having a double-sided electrode structure of the present invention. FIG. 14 is a view showing a state in which an LSI chip is bonded onto a lead frame and is connected thereto. As shown in FIG. 14, the lead frame side of the lead-frame-type double-sided electrode package will be referred to as the back face, and the side on which a circuit element is disposed on the lead frame will be referred to as the front face. As shown in FIG. 14, an LSI chip is bonded to a die pad of the lead frame by use of a die bond material such as Ag paste (chip die bond). In the illustrated example, a single LSI chip is disposed; however, a plurality of chips can be stacked. Inner lead portions of the lead frame and the LSI chip are connected together by Au bonding wires (wire bond). The end surfaces of outer lead portions for electrically connecting the lead frame to a peripheral circuit can be exposed not only to the back face of the lead frame as illustrated, but also to the side face. A plurality of lead frames are simultaneously formed from a metal plate of a Cu alloy plated with Pd through chemical corrosion patterning (etching) work or press work. The plurality of simultaneously formed lead frames are cut into individual pieces in a later process. The lead frames are shown in a state in which they have been cut into individual pieces. However, in actuality, the lead frames in this production stage are still connected together.

Figure 18:
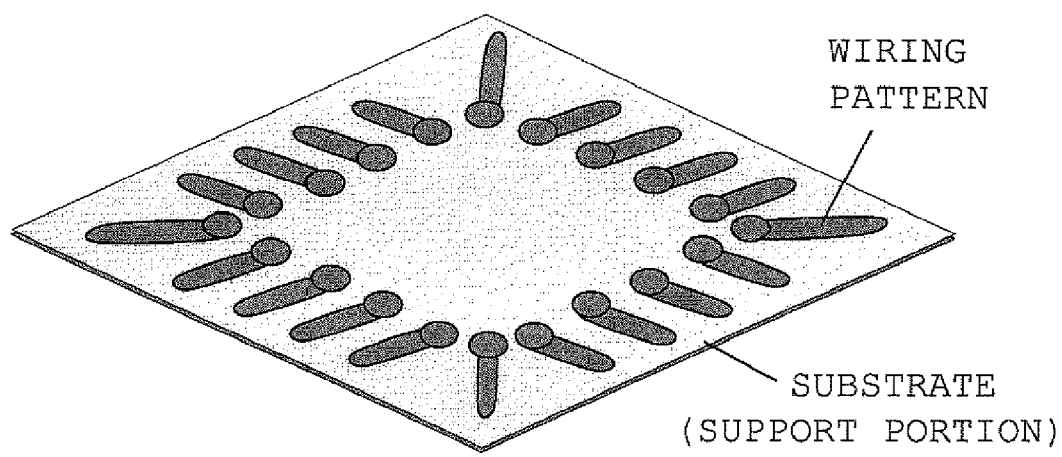
FIG. 18 is a view showing a substrate having a wiring pattern which can be used in place of the lead frame.

Instead of such a lead frame, there can be used a substrate in which a wiring pattern is formed on a substrate, serving as a support portion, by means of electroforming, as having been described with reference to FIG. 9. FIG. 18 shows a substrate (support portion) which has a wiring pattern and which can be used in place of the lead frame. A circuit element is disposed on the wiring pattern, and electrode terminals of the circuit element are electrically connected to desired portions of the wiring pattern. The illustrated substrate is separated and removed after a later resin sealing process.

Figure 15:
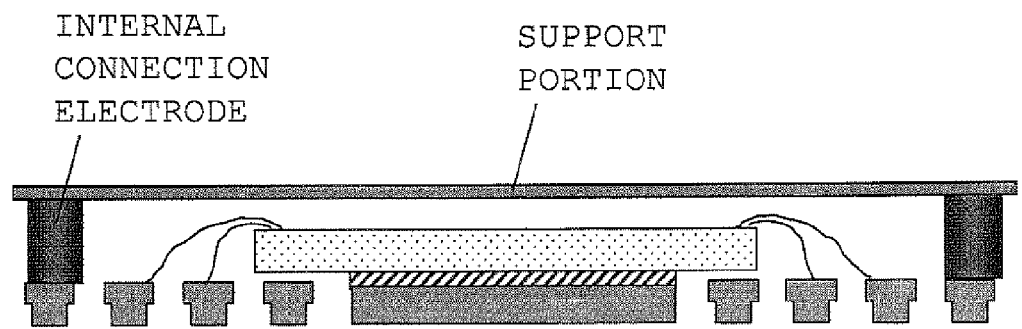
FIG. 15 is a view showing a state in which an internal connection electrode structure is fixed to the multilayer organic substrate and is connected thereto.

FIG. 15 is a view showing a state in which an internal connection electrode structure is fixed to the multilayer organic substrate and is connected thereto. The internal connection electrode structure is shown as having a structure and being formed of a material as having been described with reference to FIG. 4. However, a substrate with a wiring pattern as shown in FIG. 9 can be used. The internal connection electrodes, which are the feature of the present invention, are fixed to and electrically connected to the lead frame shown in FIG. 14 (or the substrate as shown in FIG. 18) at predetermined locations. As in the above-described first example, various connection methods, such as joining by means of ultrasonic waves and connection by use of conductive paste such as silver paste, can be used for fixing and connecting the internal connection electrodes. However, solder connection is preferred. Fixation and electrical connection can be performed easily during manufacture of the device. In a stage where the internal connection electrodes have been fixed to the lead frame at predetermined locations, all the internal connection electrodes are integrally connected by a support portion.

Figure 16:
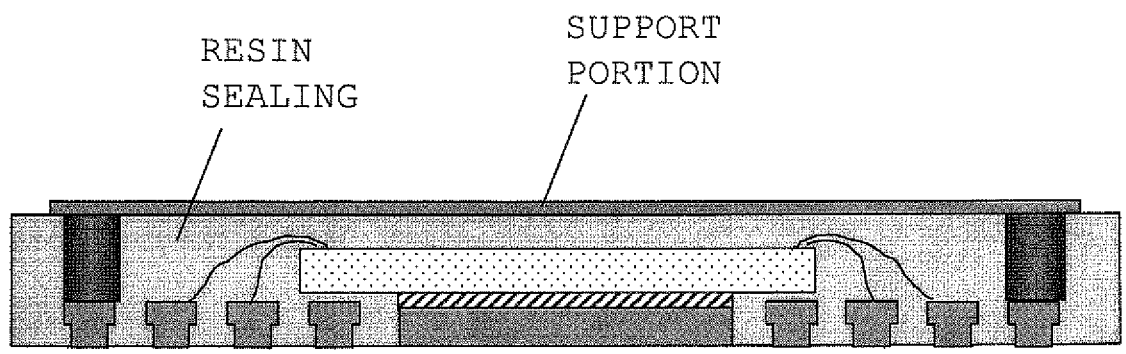
FIG. 16 is a view showing a state after resin sealing has been performed.

FIG. 16 is a view showing a state after resin sealing has been performed. After the internal connection electrodes connected together are bonded, in this state, the upper surface of the organic substrate is transfer-molded up to the lower surface of the support portion, or resin-sealed by use of a liquid resin.

Figure 17:
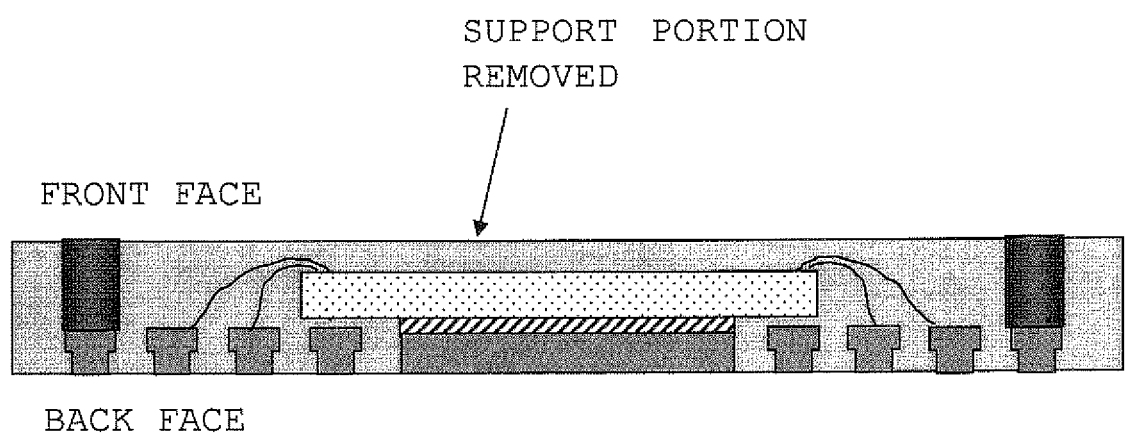
FIG. 17 is a view showing a state after the support portion has been removed.

FIG. 17 is a view showing a state after the support portion has been removed. Upon removal of the support portion, the internal connection electrodes are separated from one another. After that, dicing is performed to obtain separated chips, which are completed products. Further, rewiring can be performed on the upper surface of the resin seal by using the same method as the method used in the above-described example.

Figure 19:
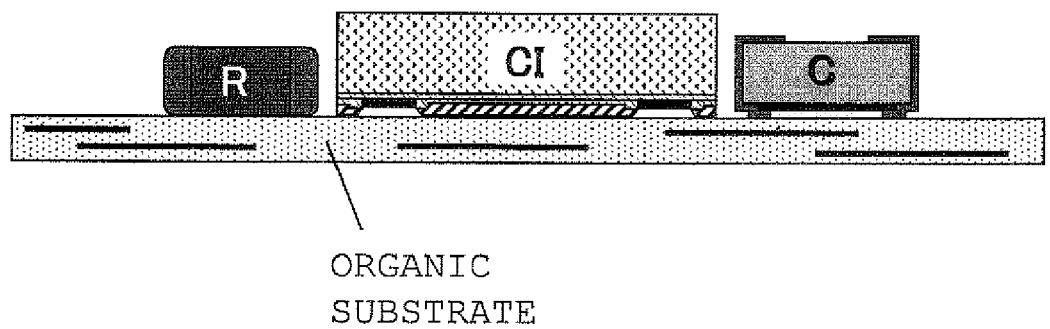
FIG. 19 is a view showing a state in which circuit elements are disposed on an organic substrate.

Next, with reference to FIGS. 19 to 23, there will be described a module-type double-sided electrode package showing a third example of a semiconductor device having a double-sided electrode structure of the present invention. First, as shown in FIG. 19, circuit elements, such as a semiconductor chip (IC chip), a resistor R, and a capacitor C, are disposed on a multilayer or single-layer organic substrate at predetermined locations, and are connected thereto. The circuit elements are flip-chip-bond connected to a wiring pattern of the uppermost layer of the multilayer or single-layer organic substrate by use of an ordinary technique.

Figure 20:
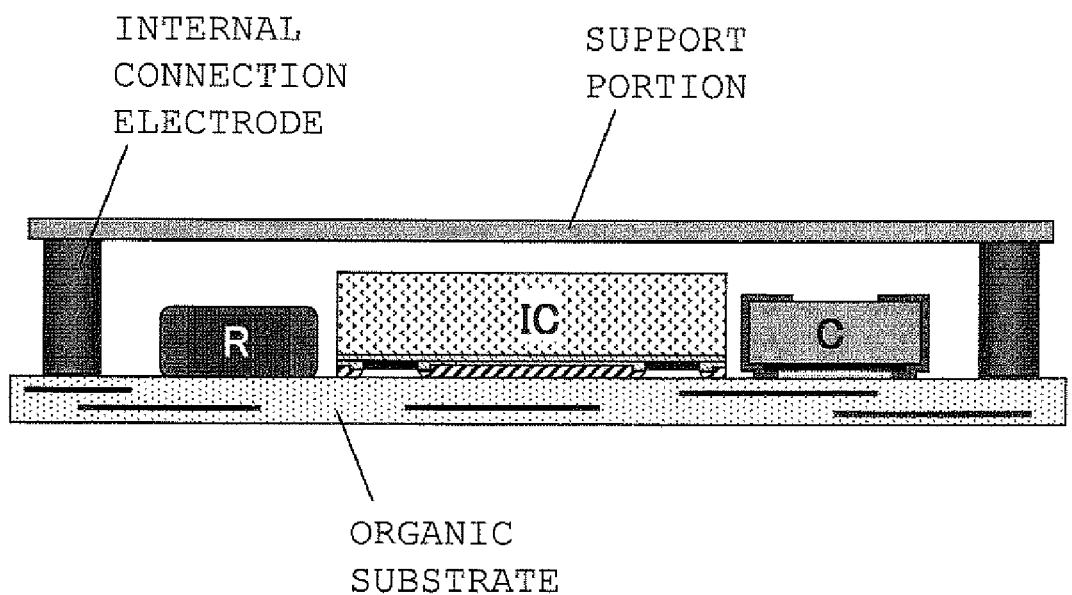
FIG. 20 is a view showing a state in which an internal connection electrode structure is bonded to the organic substrate.

FIG. 20 is a view showing a state in which an internal connection electrode structure is bonded to the organic substrate. In a stage where the internal connection electrodes have been bonded to the organic substrate at predetermined locations, all the internal connection electrodes are integrally connected by a support portion. The internal connection electrodes are electrically connected to metal pad portions for connection electrodes as having been described with reference to FIG. 2. The internal connection electrodes integrally connected may be formed of a material and have a structure as having been described with reference to FIG. 4 or 9.

Figure 21:
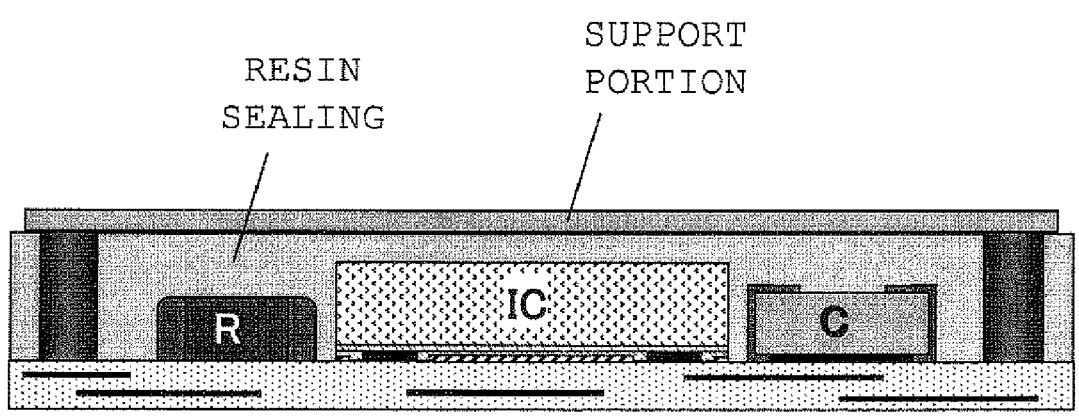
FIG. 21 is a view showing a state after resin sealing has been performed.

FIG. 21 is a view showing a state after resin sealing has been performed. After the internal connection electrodes connected together are bonded, the upper surface of the organic substrate is transfer-molded up to the lower surface of the support portion, or resin-sealed by use of a liquid resin, so as to cover the circuit elements.

Figure 22:
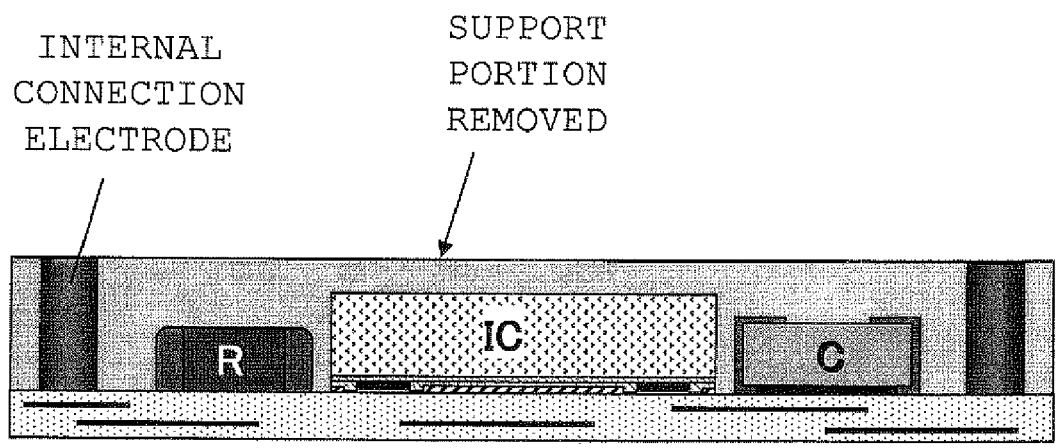
FIG. 22 is a view showing a state after the support portion has been removed.

FIG. 22 is a view showing a state after the support portion has been removed. Upon removal of the support portion, the internal connection electrodes are separated from one another. Further, rewiring can be performed on the surface of the resin seal by use of the same method as in the above-described examples.

Figure 23:
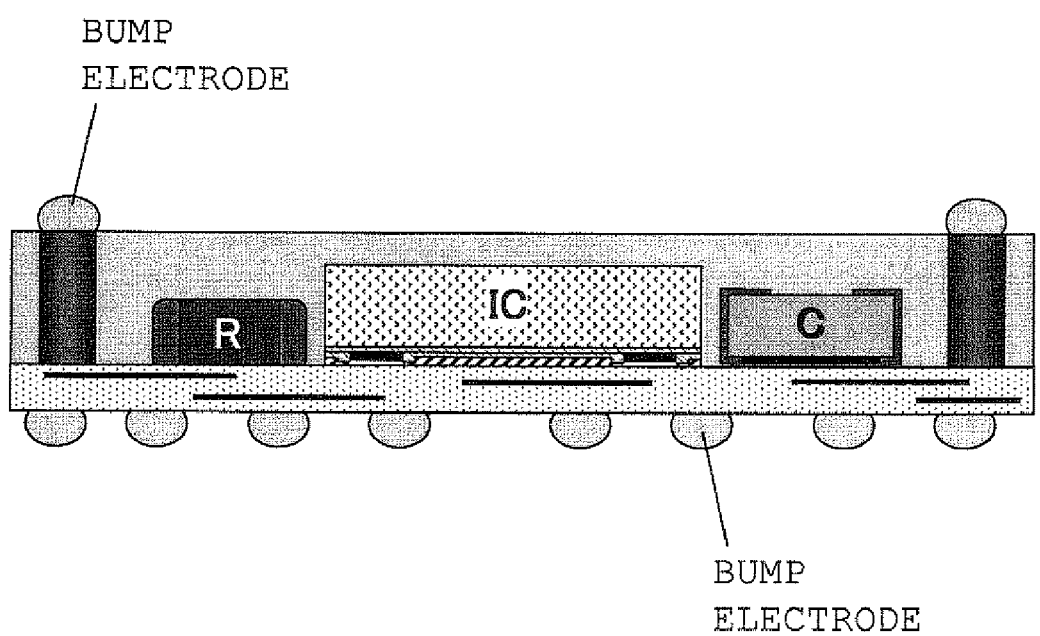
FIG. 23 is a sectional view showing a completed double-sided electrode package.

FIG. 23 is a sectional view showing a completed double-sided electrode package. External connection bump electrodes are formed on the upper surfaces of the internal connection electrodes and lands formed on the back face side. Further, dicing is performed to obtain separated chips, which are completed products.

Figure 24:
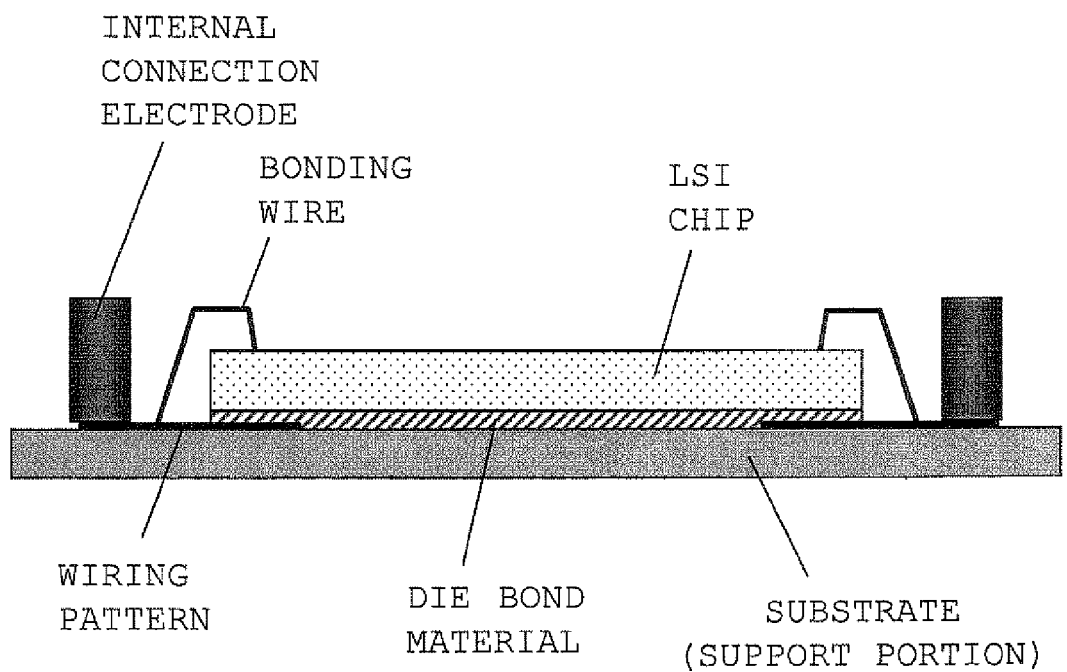
FIG. 24 is a view showing a state in which an electronic component is mounted onto a substrate and connected thereto.

Next, with reference to FIGS. 24 to 28, there will be described a double-sided electrode package showing a fourth example of a semiconductor device having a double-sided electrode structure of the present invention. FIG. 24 is a view showing a state in which an electronic component is mounted onto a substrate and connected thereto. The substrate used here has a structure and is formed of a material as having been described with reference to FIG. 9. A wiring pattern and internal connection electrodes are formed on the substrate serving as a support portion by repeating an electroforming process two times. The circuit element is disposed on the wiring pattern, and electrode terminals of the circuit element are electrically connected to predetermined portions of the wiring pattern. That is, an electronic component, including an LSI chip, is bonded to a substrate having a wiring pattern by use of a die bond material, and the electronic component is connected to the wiring pattern by use of bonding wires (wire bond connection scheme). Alternatively, the electronic component may be mounted by a flip-chip-scheme.

Figure 25:
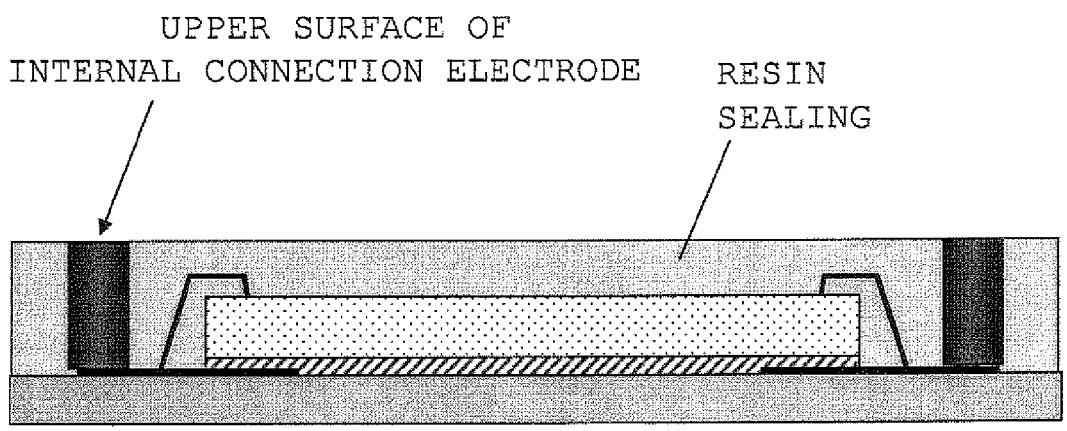
FIG. 25 is a view showing a state after resin sealing has been performed.

FIG. 25 is a view showing a state after resin sealing has been performed. The upper surface of the substrate is transfer-molded, or resin-sealed by use of a liquid resin. For the resin sealing, a mold is used, and a resin is charged up to the position of the upper surfaces of the internal connection electrodes. At that time, a heat-resisting synthetic resin tape is disposed on the upper surface within the mold; and the tape is removed after the resin is charged. Thus, it becomes possible to prevent the resin from covering the upper surfaces of the internal connection electrodes, which would otherwise be covered by the resin (insulating material) entering a space between the mold and the upper surfaces of the internal connection electrodes.

Figure 26:
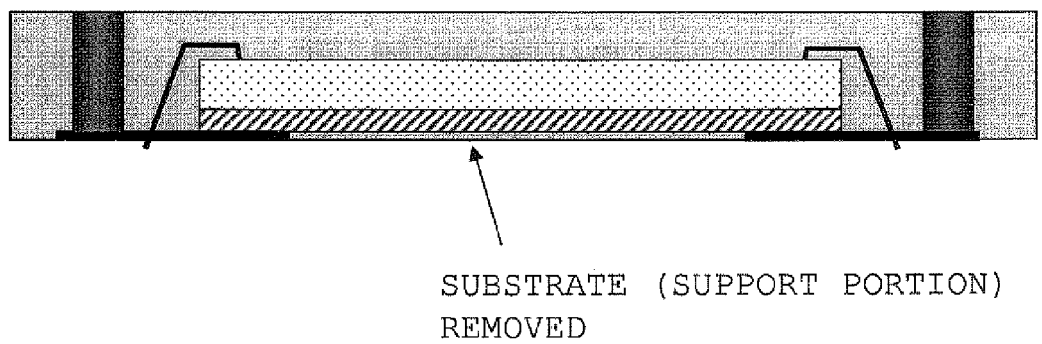
FIG. 26 is a view showing a state after the substrate (support portion) has been removed.

FIG. 26 is a view showing a state after the substrate (support portion) has been removed. The substrate (support portion), which is unnecessary for a completed product, is removed.

Figure 27:
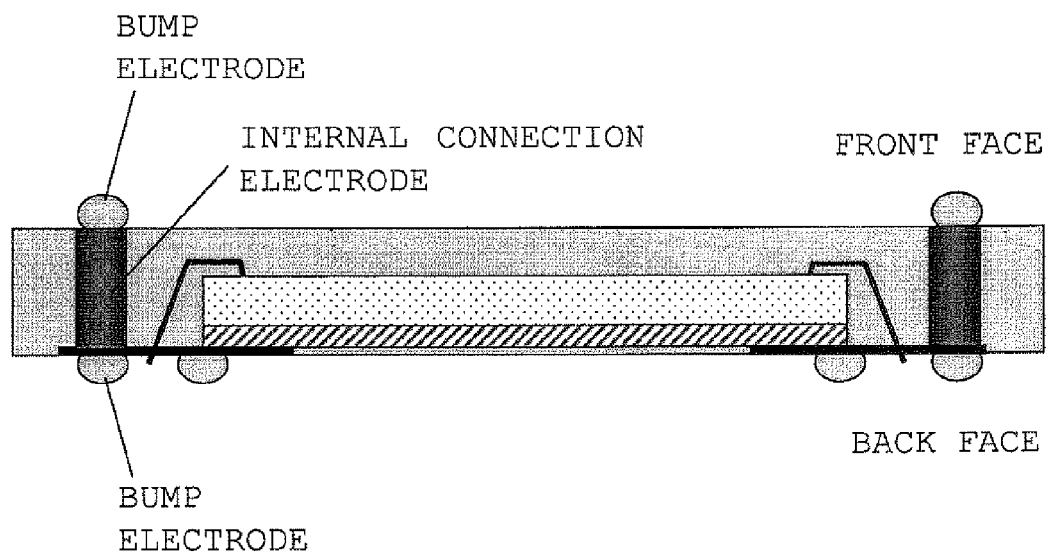
FIG. 27 is a sectional view showing a state after bump electrodes for external connections have been formed.

FIG. 27 is a sectional view showing a state after bump electrodes for external connections have been formed. On the front face side, external connection bump electrodes are formed on the upper surfaces of the internal connection electrodes. On the back face side, external connection bump electrodes are formed at predetermined positions on the wiring pattern. After that, dicing is performed to obtain separated chips, which are completed products.

Figure 28:
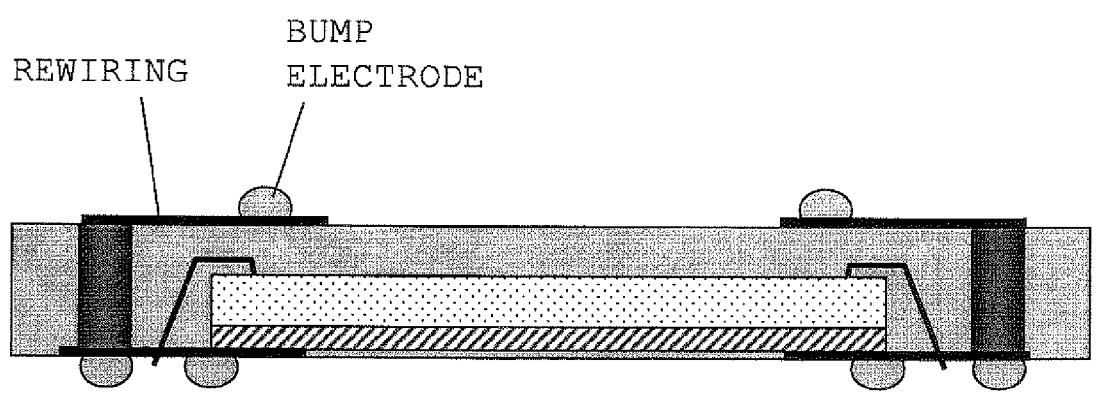
FIG. 28 is a view used for describing rewiring.

FIG. 28 is a view used for describing rewiring. Rewiring can be performed on the surface of the resin seal after the support portion removing process shown in FIG. 26. This enables external connection bump electrodes to be disposed at positions different from the positions where the head portions of the internal connection electrodes are exposed, by use of the method having been described with reference to FIG. 8.

Figure 36:
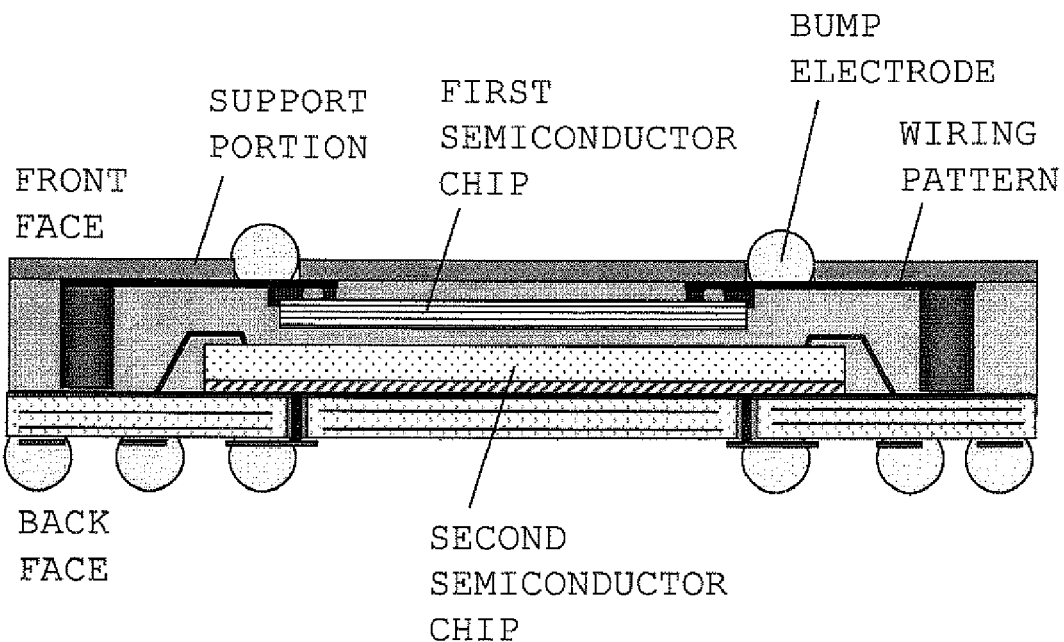
FIG. 36 is a sectional view showing a sixth example of a semiconductor device of the present invention in which double-sided electrodes for external connection are disposed.
Figure 48A:
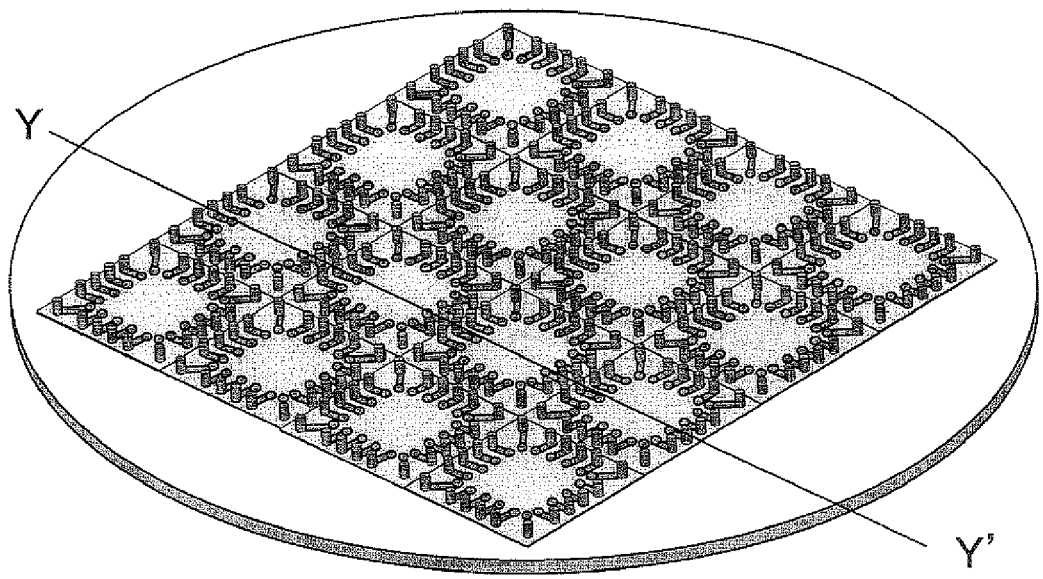
FIG. 48 is a view showing a further another example of an internal connection electrode structure differing from that of FIGS. 4 and 9.
Figure 48B:
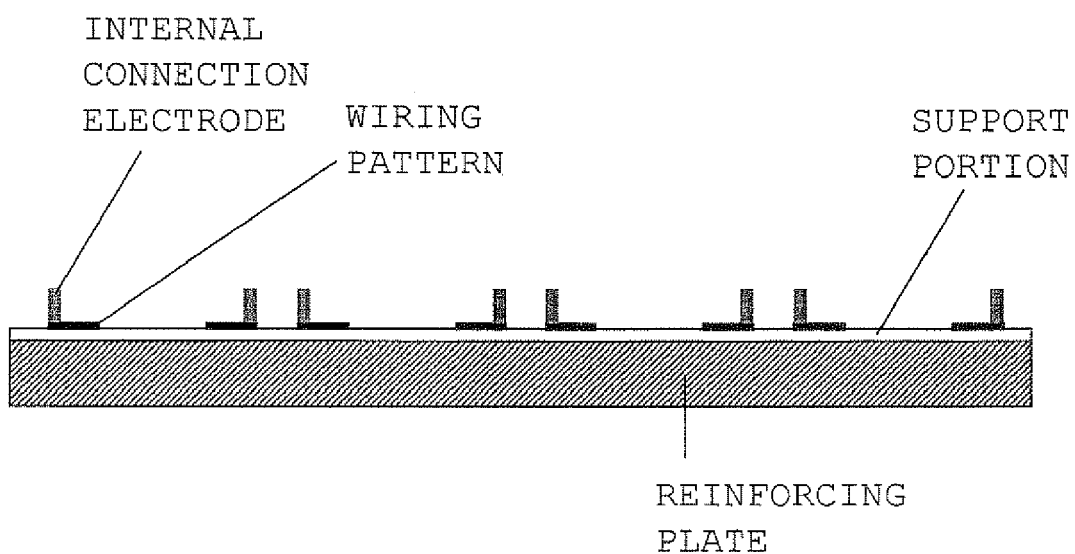
Figure 49:
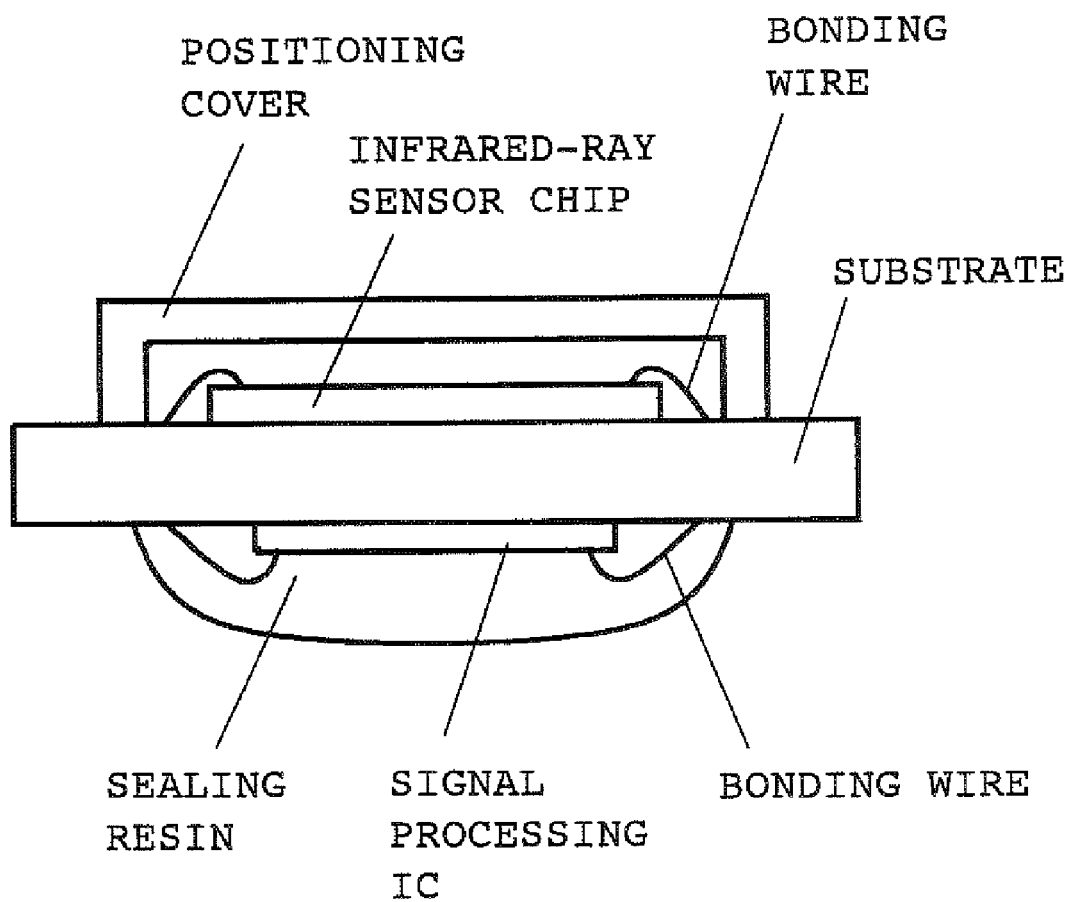
FIG. 49 is a sectional view showing a sensor module described in Patent Document 7.

Next, with reference to FIG. 48, there will be described an another method of manufacturing the internal connection electrode structure having been described with reference to FIGS. 4 and 9. FIG. 48 is a view showing a further another example of an internal connection electrode structure differing from that of FIGS. 4 and 9. FIG. 48(A) shows a perspective view of a combined structure formed by connecting a plurality of unit structures. FIG. 48(B) shows a side sectional view being cut at line Y-Y'. Although the structure of FIG. 48 has not only the internal connection electrodes supported by the support portion but also the wiring pattern connected thereto, as having been described with reference to FIG. 9, the structure may have only the internal connection electrodes supported by the support portion, as having been described with reference to FIG. 4. The internal connection electrode structure as shown in FIG. 48 can be used in all the above-described double-sided electrode packages showing the first through forth examples. The plate-shaped support portion can be formed from an insulating base material of a thin film such as polyimide tape. In the case where the insulating base material must have a greater rigidity during manufacture of a semiconductor device, there can be used a two-layer structure in which a reinforcing plate (e.g., a stainless steel plate) is bonded to the back side (the side opposite the surface on which a wiring pattern is formed) of the insulating base material. This reinforcing plate is separated and removed after the resin sealing process. The wiring pattern and the internal connection electrodes can be formed through plating. As well known, when an electroless plating technique is used, supply of electricity as in the case of electroplating is not required. Therefore, plating can be performed for non-conductive materials such as plastic and ceramic. Irrespective of the shape and type of the material, a film having a uniform thickness can be obtained. When bump electrodes are provided on the front face side, as illustrated in FIG. 36 to be described later, holes are formed in the insulating base material, which functions as a protecting film, at positions where bump electrodes are to be formed, and bump electrodes connected to the internal connection electrodes or the wiring pattern are formed.

FIG. 31 is a sectional view showing a fifth example of a semiconductor device of the present invention in which single-sided electrodes for external connection are disposed. As shown in FIG. 31, the organic substrate side will be referred to as the back face, and the side on which first and second semiconductor chips are disposed on the substrate will be referred to as the front face. The second semiconductor chip, such as an LSI chip, is bonded to the organic substrate by use of a die bond material, and is connected to a wiring pattern of the uppermost layer of the organic substrate by use of bonding wires (wire bond connection scheme). An internal connection electrode structure is fixed to and electrically connected to the wiring pattern of the organic substrate. The first semiconductor chip is attached to the internal connection electrode structure. The upper surface of the organic substrate is sealed with resin so as to cover the LSI chips (the first and second semiconductor chips) and the bonding wires. External connection bump electrodes are formed on the back face side of the organic substrate.

Next, a process of manufacturing the fifth example semiconductor device shown in FIG. 31, in which single-sided electrodes for external connection are disposed, will be described step by step with reference to FIGS. 32 to 35. The internal connection electrode structure can have a structure as having been described with reference to FIG. 48. The plate-shaped support portion can be formed from an insulating base material of a thin film such as polyimide tape. In the case where the insulating base material must have a greater rigidity during manufacture of a semiconductor device, there can be used a two-layer structure in which a reinforcing plate (e.g., a stainless steel plate) is bonded to the back side (the side opposite the surface on which a wiring pattern is formed) of the insulating base material. This reinforcing plate is separated and removed after the resin sealing process, which will be described later with reference to FIG. 35.

The support portion of the internal connection electrode structure shown in this example functions as a protecting film after the manufacture of the semiconductor device is completed. Therefore, the support portion is not required to be separated from the semiconductor device. In such a case, formation of a wiring pattern and subsequent formation of internal connection electrodes can be performed through plating. Alternatively, it is possible to form only the wiring pattern through plating, and then attach internal connection electrodes thereto, as in a known technique. For example, a leading end of a metal wire of nickel, copper, a nickel alloy, or a copper alloy is heated and melted to thereby form a ball, and the ball is attached to a predetermined position on the wiring pattern under application of heat and pressure as well as ultrasonic waves. Subsequently, the metal wire is cut, whereby an internal connection electrode can be attached.

The manufacturing step used for describing electroforming and shown in the process chart of FIG. 29 can be applied to the case of plating. In the case of plating, instead of a conductive member such as stainless steel, an insulating member is used for the mother die, and used as a protecting film of the semiconductor device, without being removed. However, in the case where the support portion must be separated and removed as in the case of a seventh example of a semiconductor device, which will be described later with reference to FIGS. 37 to 40, the wiring pattern and the internal connection electrodes are formed through electroforming, rather than plating. In the seventh example, the process shown in FIGS. 29(a) to 29(d) is repeated two times so as to form the wiring pattern in the first process, and then form the internal connection electrodes to be connected to the wiring pattern in the second process.

Figure 32A:
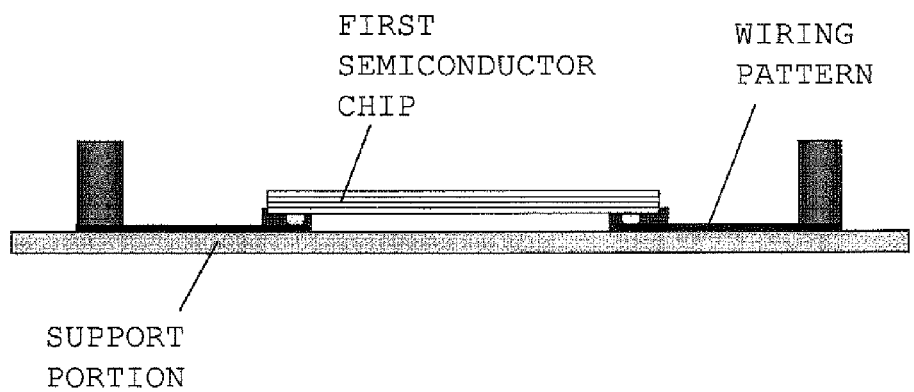
FIGS. 32(A) and 32(B) are sectional and perspective views of an internal connection electrode structure shown in a state in which a first semiconductor chip is connected thereto.
Figure 32B:
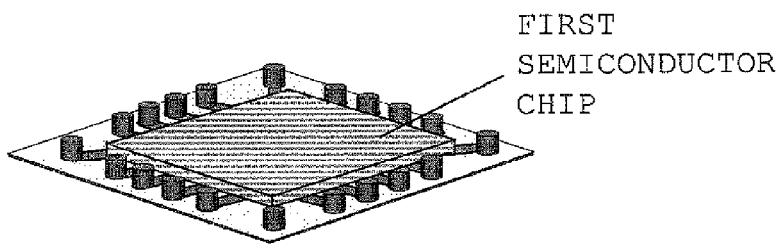

FIGS. 32(A) and 32(B) are sectional and perspective views of then internal connection electrode structure shown in a state in which the first semiconductor chip is connected thereto. In the illustrated internal connection electrode structure, the first semiconductor chip, such as a sensor chip, is mounted on the wiring pattern supported by the support portion, and is electrically connected to the wiring pattern by means of, for example, flip-chip bond connection.

Figure 33:
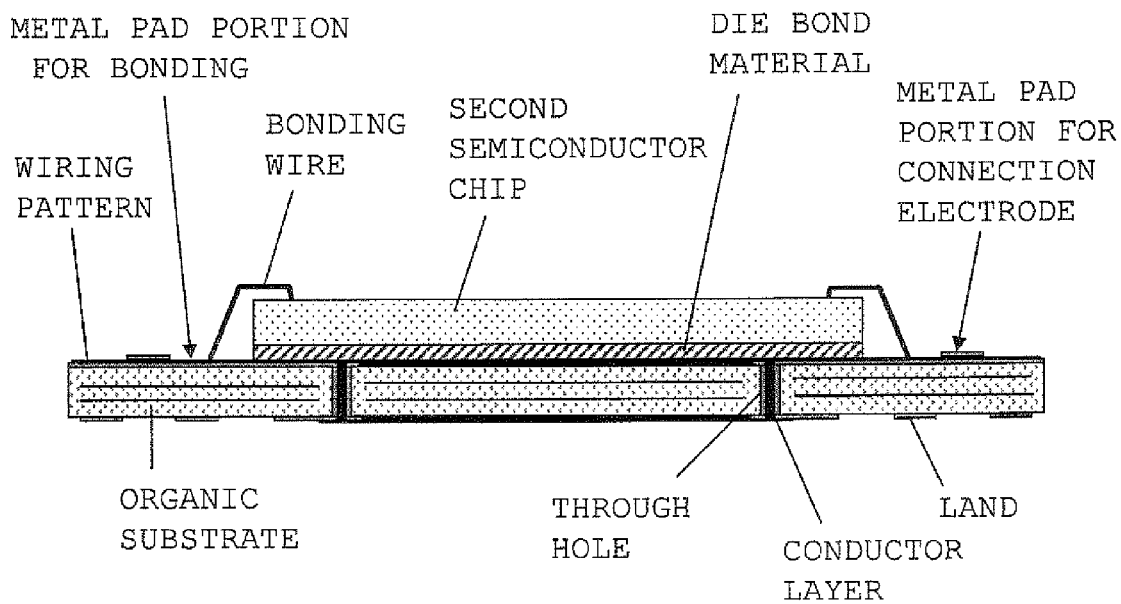
FIG. 33 is a view showing a state in which a second semiconductor chip is bonded to and connected to a multilayer organic substrate.

Next, the internal connection electrode structure as shown in FIG. 32 is fixed to and electrically connected to a separately assembled organic substrate as shown in FIG. 33. FIG. 33 is a view showing a state in which the second semiconductor chip is bonded to and connected to the multilayer organic substrate. The second semiconductor chip is illustrated as being bonded to the multilayer organic substrate by use of a die bond material and being connected to the wiring pattern of the uppermost layer of the organic substrate. Metal pad portions for bonding, which serve as bonding wire connection electrodes, are formed on the wiring pattern of the uppermost layer of the multilayer or single-layer organic substrate, and wiring extending to the pad portions is formed. The metal pad portions on the front face of the multilayer or single-layer organic substrate and the second semiconductor chip are connected together by means of Au bonding wires. Alternatively, the semiconductor chip can be flip-chip-bond connected to the organic substrate (not shown). In this case, the semiconductor chip is flip-chip-bond connected to the wiring pattern of the uppermost layer of the multilayer or single-layer organic substrate by use of an ordinary technique.

Figure 34:
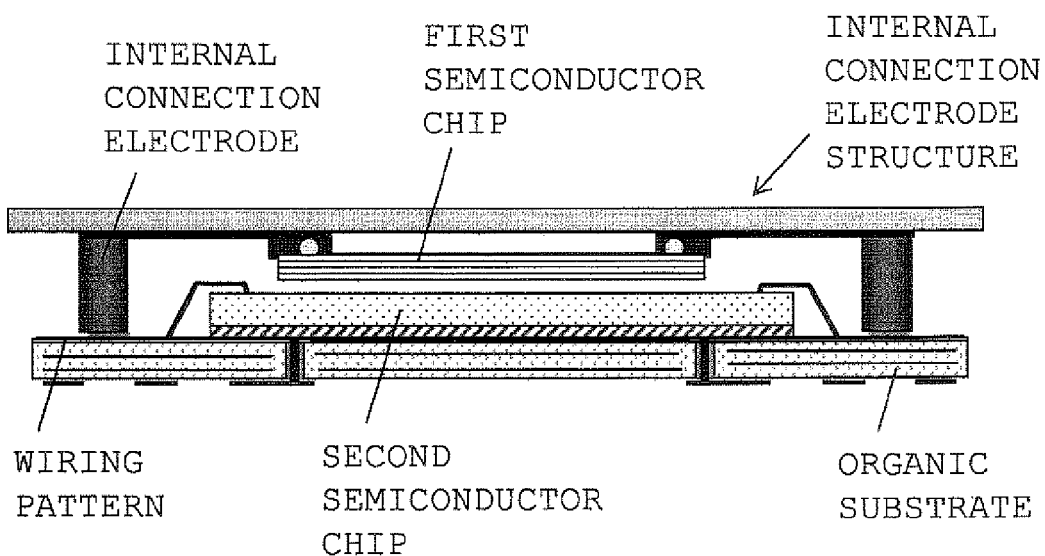
FIG. 34 is a view showing a state in which the internal connection electrode structure carrying the first semiconductor chip attached thereto is fixed and connected to the organic substrate carrying the second semiconductor chip attached thereto.

FIG. 34 is a view showing a state in which the internal connection electrode structure carrying the first semiconductor chip attached thereto (see FIG. 32) is fixed and connected to the organic substrate carrying the second semiconductor chip attached thereto (see FIG. 33). The internal connection electrodes are fixed to and electrically connected to the wiring pattern of the organic substrate at predetermined positions. Fixation and connection of the internal connection electrodes can be performed by (1) joining by ultrasonic waves, (2) connection by electrically conductive paste such as silver paste, (3) solder connection, or (4) a method of forming recesses in the metal pad portions for connection electrodes provided on the organic substrate, forming projections on the internal connection electrode structure, and inserting the projections into the recesses, followed by crimping.

Figure 35:
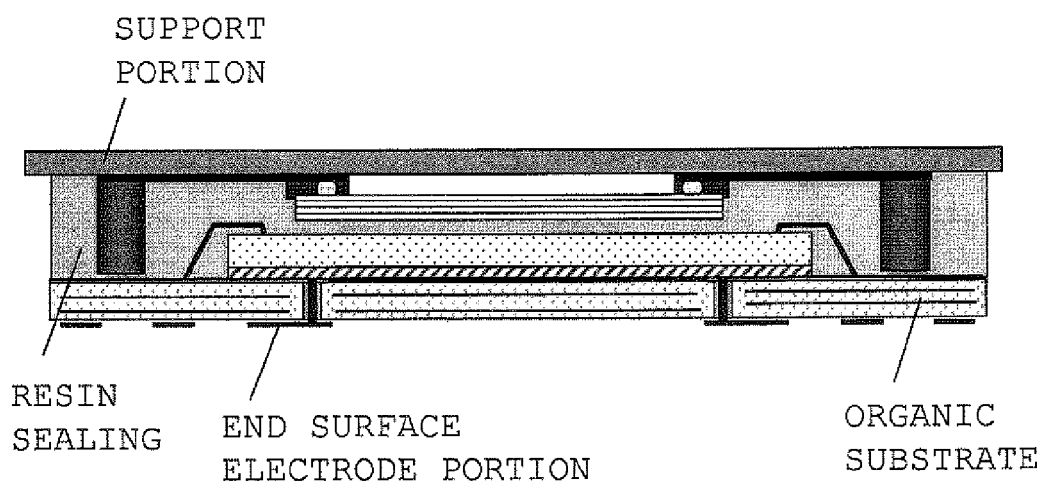
FIG. 35 is a view after resin sealing has been performed.

FIG. 35 is a view after resin sealing has been performed. After the internal connection electrodes connected together are fixed, in this state, the upper surface of the organic substrate is transfer-molded up to the lower surface of the support portion, or resin-sealed by use of a liquid resin (e.g., epoxy resin).

The structure obtained in this stage can be used as a completed product. However, as having been described with reference to FIG. 31, external connection bump electrodes may be formed on the end surface electrode portions (lands) formed on the back face side of the internal connection electrodes. Further, dicing is performed to obtain separated chips, which are completed products.

FIG. 36 is a sectional view showing a sixth example of a semiconductor device of the present invention in which double-sided electrodes for external connection are disposed. In the fifth example, external connection bump electrodes are formed on the back face side after the process shown in FIG. 35. In contrast, in the sixth example, external connection bump electrodes are formed not only on the back face side but also on the front face side. The bump electrodes on the front face side are formed as follows. Holes are formed in the support portion, which functions as a protecting film, at positions where bump electrodes are to be formed, and bump electrodes connected to the wiring pattern are formed. In this manner, a semiconductor device having a double-sided electrode structure including first and second semiconductor chips is manufactured.

Figure 37:
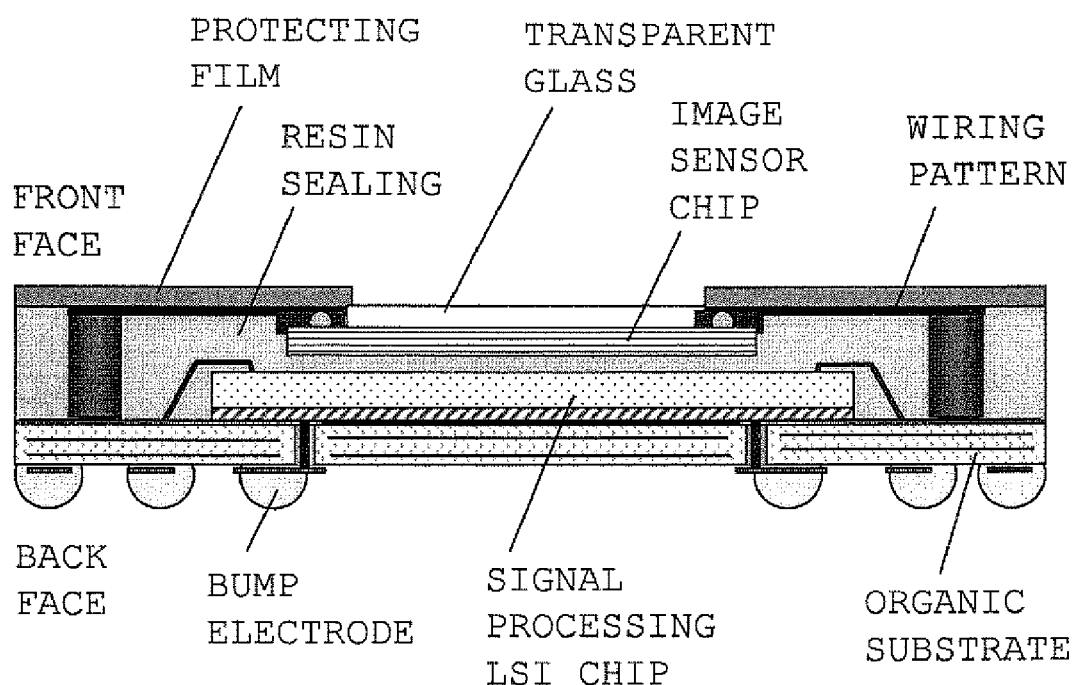
FIG. 37 is a sectional view showing a seventh example of a semiconductor device of the present invention which is applied to an image sensor module and in which single-sided electrodes for external connection are disposed.

FIG. 37 is a sectional view showing a seventh example of a semiconductor device of the present invention which is applied to an image sensor module and in which single-sided electrodes for external connection are disposed.

In the seventh example, an image sensor chip is attached as a first semiconductor chip, and a signal processing LSI chip is attached as a second semiconductor chip. A transparent glass is disposed on the upper surface of the image sensor chip, and an external light beam reaches a light-receiving element area of the image sensor chip via the transparent glass.

That is, an internal connection electrode structure having internal connection electrodes integral with a support portion (see FIG. 38) is formed; and an image sensor chip (first semiconductor chip) and a transparent glass are attached to the internal connection electrode structure. This structure is connected to an organic substrate carrying a signal processing LSI chip (second semiconductor chip), and a resin is charged into a space between the support portion and the organic substrate. After that, the support portion is removed, and a protecting film is applied to the exposed wiring pattern on the upper surface.

Figure 38A:
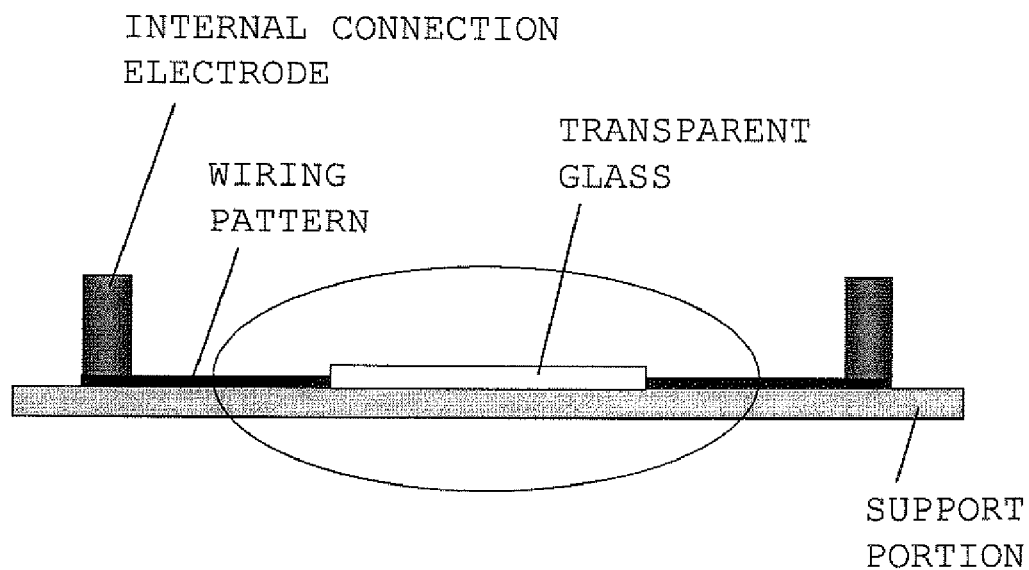
FIG. 38(A) is a view showing a state in which a transparent glass is attached to a support portion.
Figure 38B:
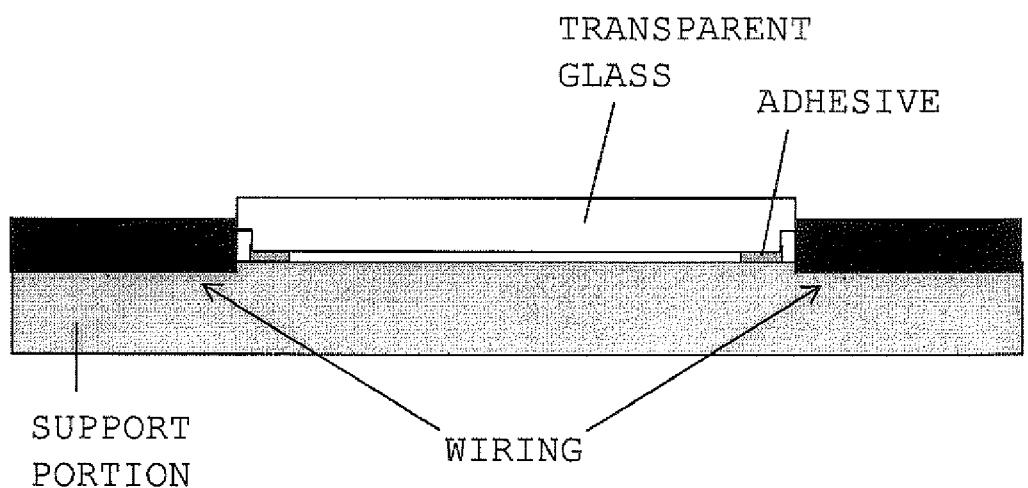
FIG. 38(B) is an enlarged view thereof.
Figure 39:
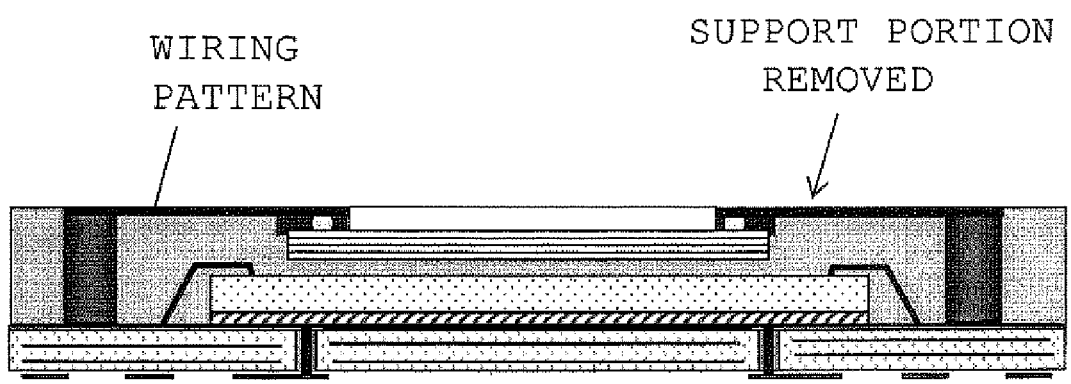
FIG. 39 is a view showing a state after the support portion has been removed.

Next, a process for manufacturing the seventh example semiconductor device shown in FIG. 37 and applied to an image sensor module will be described with reference to FIGS. 38 to 40. FIG. 38(A) is a view showing a state in which a transparent glass is attached to a support portion, and FIG. 38(B) is an enlarged view thereof. After the process shown in FIG. 2, a transparent glass is attached as shown in FIG. 38. However, unlike the fifth and sixth examples, in the seventh example, the support portion is formed by a conductive material which can be used as a mother die for electroforming. A wiring pattern and internal connection electrodes are formed on the conductive support portion by use of the above-described electroforming. This conductive support portion is removed in a later process.

Wiring is performed in an area in which the transparent glass is not located. The transparent glass is attached to the plate-shaped support portion by use of an adhesive. The transparent glass may have a circular shape or a rectangular shape. This attachment is performed by provisional fixing so as to facilitate removal of the support portion later. The attachment of the glass to the support portion is performed by use of an adhesive which facilitate subsequent removal of the support portion from the glass, for example, through application of heat (sealing process). Desirably, the edge of the transparent glass has a shape for providing an anchor effect so as to improve adhesion of the resin.

After that, a process of fixing the internal connection electrode structure to the organic substrate as having been described with reference to FIG. 34 and a resin sealing process as having been described with reference to FIG. 35 are performed, and the support portion (electroforming mother die) is removed. FIG. 39 is a view showing a state after the support portion has been removed.

Figure 40:
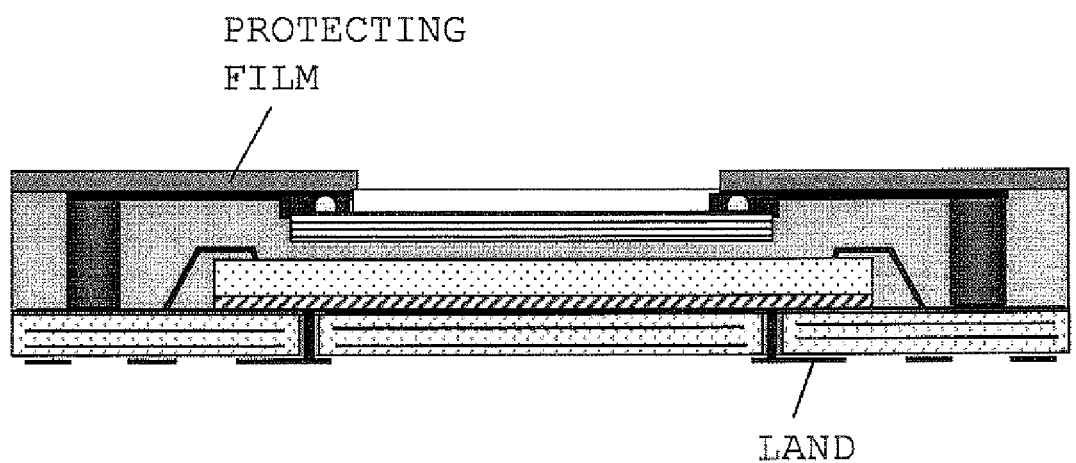
FIG. 40 is a view showing a state after protecting film has been applied to an exposed upper surface wiring.

Next, as shown in FIG. 40, a protecting film (e.g., solder resist) is applied to the exposed wiring on the upper surface. The structure obtained in this stage can be used as a completed product. However, as having been described with reference to FIG. 37, external connection bump electrodes may be formed on the end surface electrode portions (lands) formed on the back face side.

Figure 41:
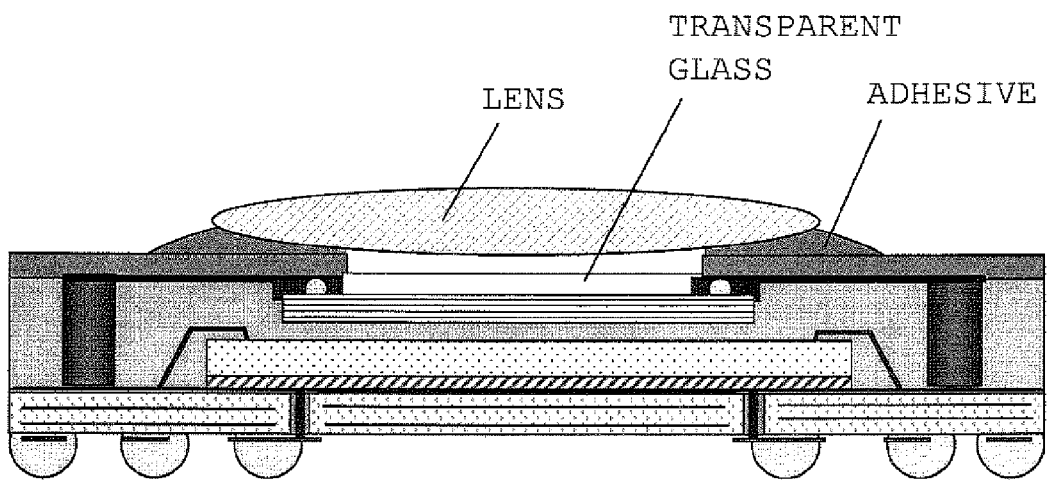
FIG. 41 is a view exemplifying a semiconductor device with a lens which has a single-sided electrode structure and in which the lens is integrally connected thereto.

FIG. 41 is a view exemplifying a semiconductor device with a lens which has a single-sided electrode structure and in which the lens is integrally connected thereto. After the process shown in FIG. 40, a lens is bonded by use of an adhesive so as to cover the upper surface of the transparent glass. Thus, a camera module with a lens is completed.

Figure 42:
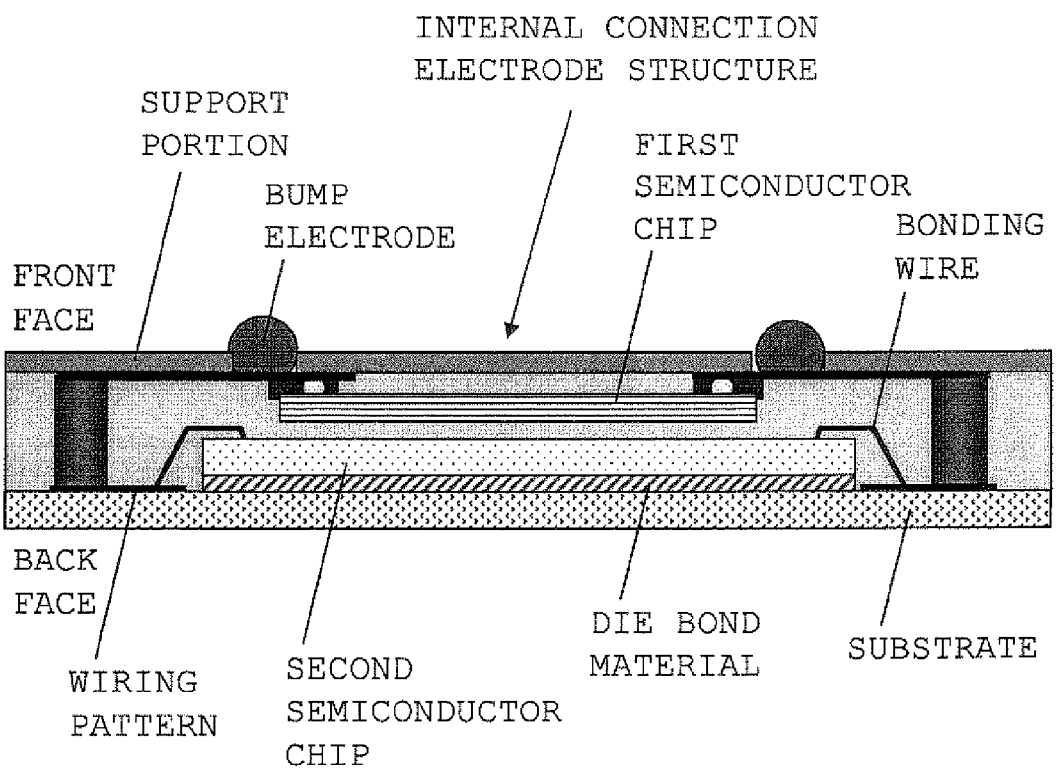
FIG. 42 is a sectional view showing an eighth example of a semiconductor device of the present invention in which single-sided electrodes for external connection are disposed.

FIG. 42 is a sectional view showing an eighth example semiconductor device of the present invention in which single-sided electrodes for external connection are disposed. In the above-described semiconductor device, an organic substrate is used. In contrast, in the eighth example, an ordinary substrate including no wiring layer therein, e.g., a Si substrate, is used. A wiring pattern is formed on a surface of the substrate by use of semiconductor process techniques such as lithography and plating. In the illustrated example, the second semiconductor chip is bonded to the wiring pattern by use of a die bond material, and connected to the wiring pattern on the substrate.

An internal connection electrode structure as having been described with reference to FIG. 32 is fixed to and electrically connected to the wiring pattern of the substrate at predetermined positions. After that, resin sealing is performed as having been described with reference to FIG. 35.

After that, bump electrodes are formed on the front face side. The bump electrodes are formed as follows. Holes are formed in the insulating support portion, which functions as a protecting film, at positions where bump electrodes are to be formed, and bump electrodes connected to the wiring pattern are formed. Thus, a semiconductor device having a single-sided electrode structure and including the first and second semiconductor chips is manufactured on a substrate.

Figure 43A:
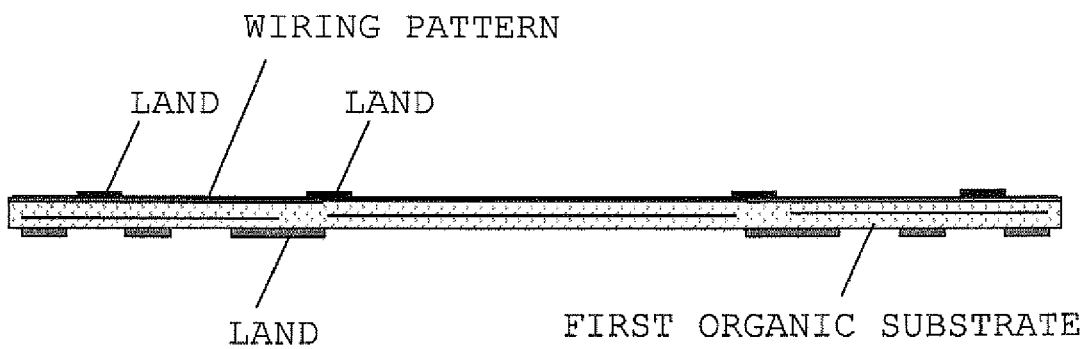
FIG. 43 is a set of views showing a different example of the internal connection electrode structure used in a ninth example of the present invention.
Figure 43B:
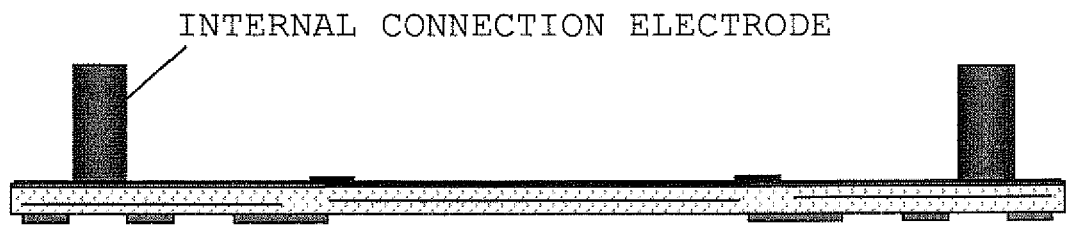
Figure 43C:
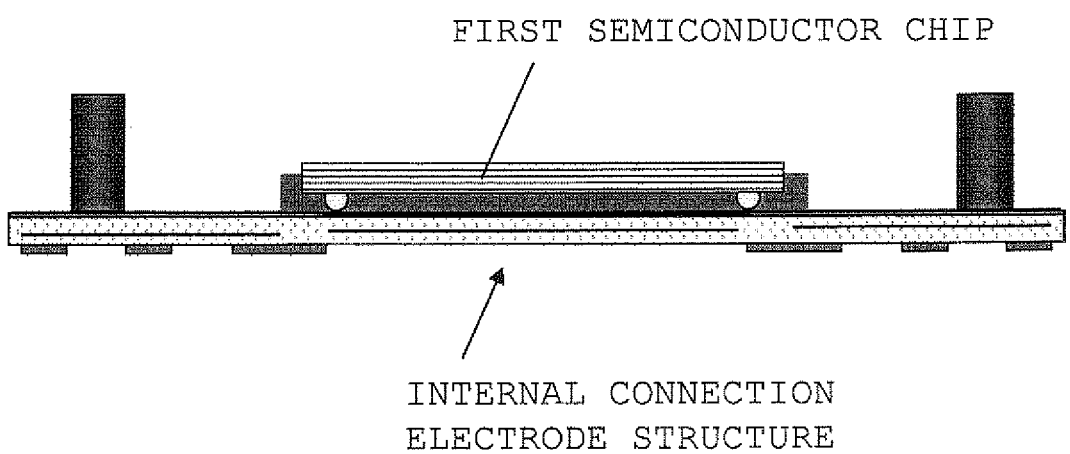
Figure 44:
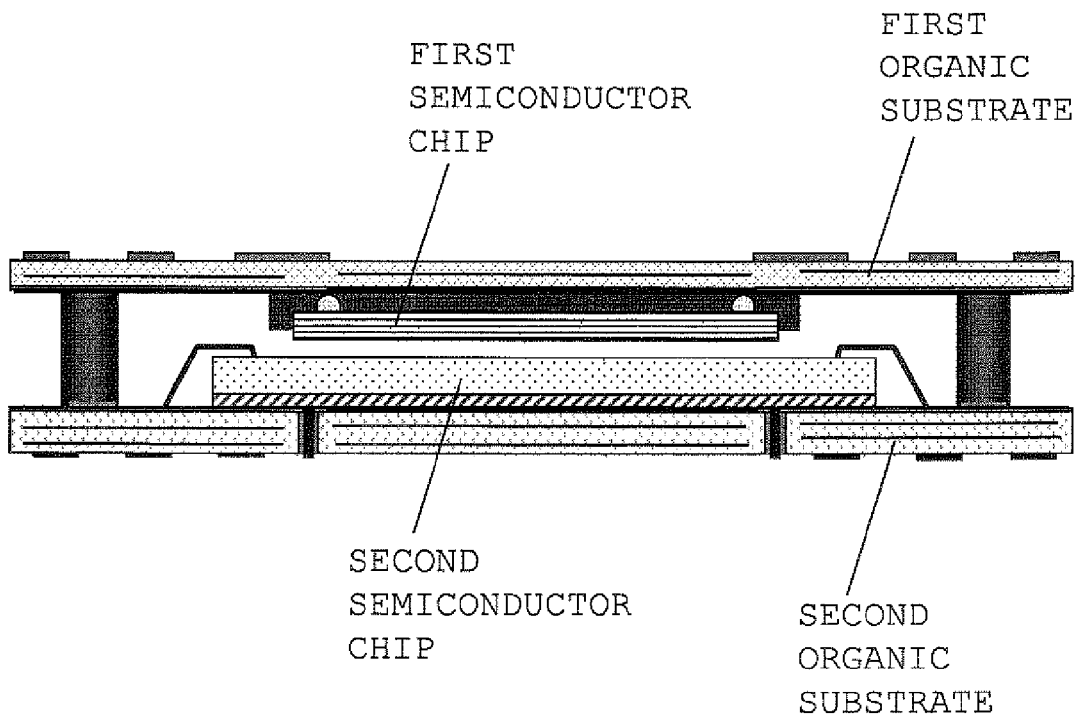
FIG. 44 is a view showing a state in which the internal connection electrode structure is connected to a second organic substrate carrying a second semiconductor chip attached thereto.
Figure 45:
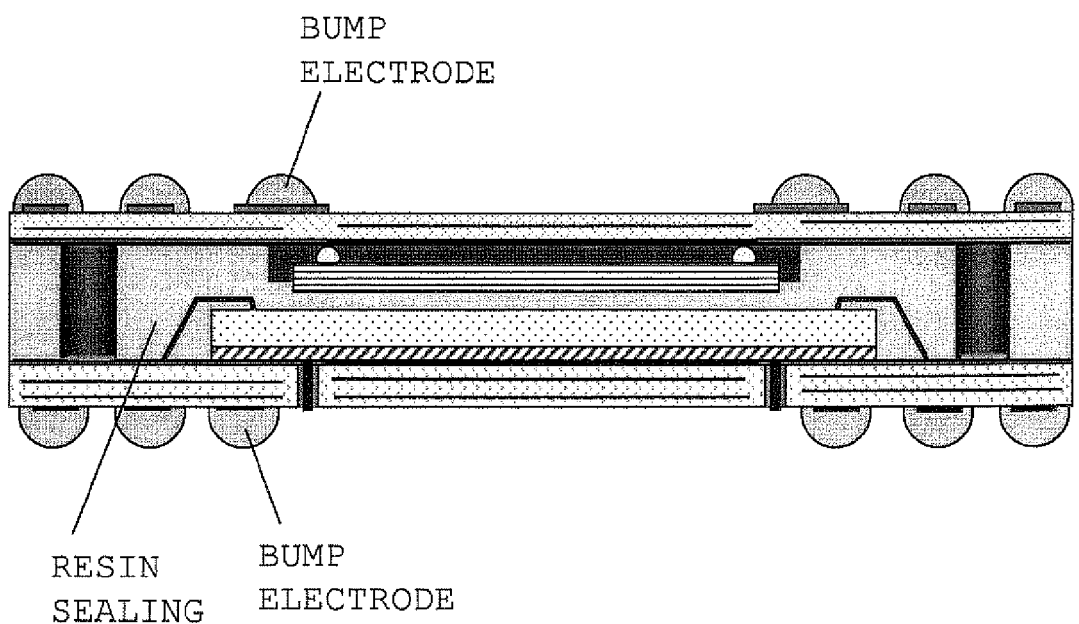
FIG. 45 is a complete view of a semiconductor device having a double-sided electrode structure.

FIGS. 43 to 45 are views used for describing a method of manufacturing an ninth example semiconductor device of the present invention in which double-sided electrodes for external connection are disposed. FIG. 43 is a set of views showing a different example of the internal connection electrode structure used in the ninth example of the present invention. This structure differs from the example shown in FIG. 9 in that a multilayer organic substrate having end surface electrode portions (lands) formed on the opposite surfaces is used as a support portion. FIG. 43(A) is a view showing the multilayer organic substrate (first organic substrate) itself. FIG. 43(B) shows a state in which internal connection electrodes are connected to lands connected to a wiring pattern formed on one face of the substrate. The internal connection electrodes can be electrically and mechanically connected by the above-described connection method in which the leading end of a metal wire is heated and melted to thereby form a ball, the ball is attached to a predetermined position on the wiring pattern under application of heat and pressure as well as ultrasonic waves, and the metal wire is then cut. Alternatively, the internal connection electrodes each machined into the form of a circular column or a rectangular column may be pin-inserted into the wiring pattern at predetermined position. Alternatively, the internal connection electrodes may be formed through plating.

Next, as shown in FIG. 43(C), a first semiconductor chip is attached to the organic substrate and is connected to lands on the wiring pattern. Although the above-described bonding wire connection method can be used for the connection, in the illustrated example, the first semiconductor chip is flip-chip bond connected to the wiring pattern (lands) of the first organic substrate. The internal connection electrode structure formed in this manner is fixed to the organic substrate (second organic substrate) as having been described with reference to with reference to FIG. 33.

FIG. 44 is a view showing a state in which the internal connection electrode structure is connected to the second organic substrate carrying a second semiconductor chip attached thereto. After that, as shown in FIG. 45, as in the above-described example, the resin sealing process is carried out, and bump electrodes are formed on end surface electrode portions (lands) on the opposite faces. In this manner, a semiconductor device having a double-sided electrode structure is completed.

Figure 46:
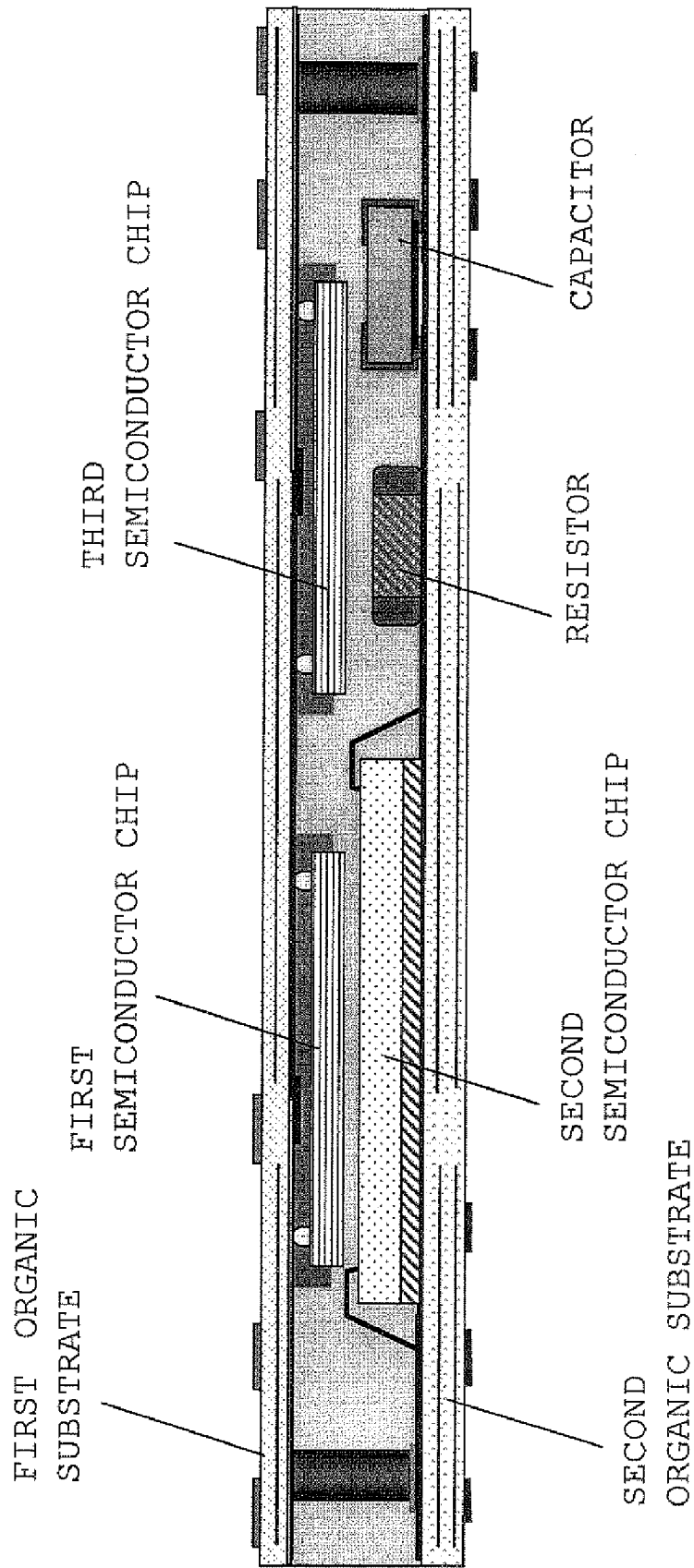
FIG. 46 is a sectional view showing a tenth example of a semiconductor device of the present invention in which a plurality of elements and electrodes for external connection are disposed.

FIG. 46 is a sectional view showing a tenth example of a semiconductor device of the present invention in which a plurality of elements and electrodes for external connection are disposed. In the example shown in FIG. 46, in addition to the first and second semiconductor chips, a third semiconductor chip, a resistor, and a capacitor are attached. As described above, the present invention makes it possible to dispose not only the first and second semiconductor chips, but also other semiconductor chips and circuit elements.

Figure 47:
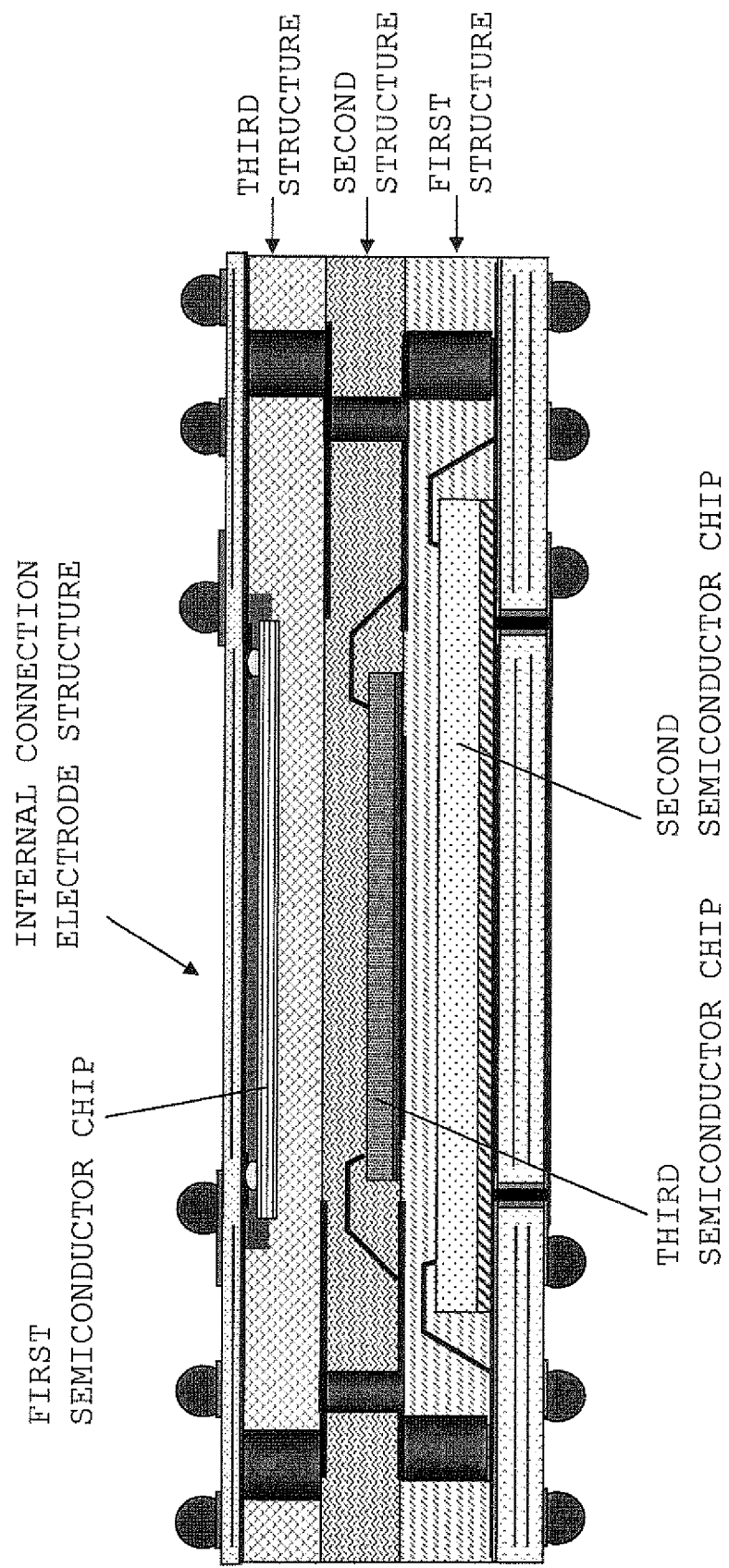
FIG. 47 is a sectional view showing an eleventh example of a semiconductor device of the present invention in which electrodes for external connection are disposed.

FIG. 47 is a sectional view showing an eleventh example of a semiconductor device of the present invention in which external connection electrodes are disposed. As shown in FIG. 47, a plurality of internal connection electrode structures (first, second, and third structures) are connected in a stacked fashion on the organic substrate on which the second semiconductor chip has been attached as having been described with reference to FIG. 33. At least the uppermost third structure is manufactured as shown in FIG. 43, and the first semiconductor chip is attached thereto. In FIG. 47, the third semiconductor chip is shown as being attached to the upper side of the first structure. As described above, the present invention facilitates formation of a stacked structure.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of manufacturing a semiconductor device having a double-sided electrode structure in which a circuit element, including a semiconductor chip, is disposed and resin-sealed, and external connection electrodes connected to the circuit element are disposed on a front face and a back face of the semiconductor device, the method comprising the steps of:
    disposing the circuit element on an organic substrate and connecting the circuit element to a wiring pattern provided on the organic substrate;
    forming internal connection electrodes on a support of a conductive material through electroforming such that the internal connection electrodes are integrally connected to the support of the conductive material;
    connecting first ends of the internal connection electrodes, which are integrally connected by the support of the conductive material, to the wiring pattern at predetermined positions;
    charging a resin after said first ends of the internal connection electrodes are connected to said wiring pattern;
    removing, after said resin for covering the circuit element is charged for resin sealing, the support of the conductive material so as to separate the internal connection electrodes from one another;
    using second ends of the internal connection electrodes as front face external connection electrodes on the front face; and
    connecting back face external connection electrodes on the back face to the wiring pattern via a conductor layer within the organic substrate.

2. A method of manufacturing a semiconductor device having a double-sided electrode structure according to claim 1, wherein rewiring is performed on an upper surface of the resin, and the back face external connection electrodes are disposed at positions different from those of the internal connection electrodes.

3. A method of manufacturing a semiconductor device having a double-sided electrode structure according to claim 2, wherein the rewiring is performed by means of ink jet printing or screen printing, or electroless plating performed after formation of a seed layer pattern.

4. A method of manufacturing a semiconductor device having a double-sided electrode structure according to claim 3, wherein said rewiring comprises copper particles, and reduction processing is performed by use of atomic hydrogen in order to remove oxide films of the copper particles.

5. A method of manufacturing a semiconductor device having a double-sided electrode structure according to claim 2, wherein the rewiring is performed by forming a wiring pattern on the support of the conductive material through electroforming together with the internal connection electrodes.

6. A method of manufacturing a semiconductor device, the method comprising:
    providing a circuit element;
    providing end surface electrodes;
    providing an organic substrate, said organic substrate comprising an organic substrate wiring pattern, said organic substrate comprising an organic substrate conductive layer, said organic substrate having an organic substrate surface, said organic substrate surface defining a bottom face, said end surface electrodes being arranged on or adjacent to said bottom face;
    disposing said circuit element on said organic substrate and connecting said circuit element to said organic substrate wiring pattern;
    providing a support comprising a conductive material;
    forming internal connection electrodes on said support such that the internal connection electrodes are integrally connected to the support of the conductive material, said internal connection electrodes comprising first ends and second ends, said first ends being integrally connected to said support;
    connecting said first ends of said internal connection electrodes to said organic substrate wiring pattern, at least said circuit element, said support and said organic substrate defining a resin receiving space;
    providing a resin;
    filling said resin receiving space with said resin after connecting said first ends to said organic substrate wiring pattern such that at least said circuit element is sealed with said resin, said resin having a resin surface, said resin surface defining a front face, said front face being opposite said bottom face;
    removing said support after filling said resin receiving space with said resin such that said internal connection electrodes are separated from one another, said second ends of said internal electrodes defining external connection electrodes on said front face, said external connection electrodes being connected to said end surface electrodes via said organic substrate conductive layer, said organic substrate conductive layer being connected to said organic substrate wiring pattern.

7. A method in accordance with claim 6, wherein said resin engages at least said circuit element, said support, said internal connection electrodes and said organic substrate prior to said support being removed.

8. A method in accordance with claim 6, wherein said resin engages at least said circuit element, said internal connection electrodes and said organic substrate.

9. A method in accordance with claim 6, wherein rewiring is performed on said resin surface, said external connection electrodes being disposed at different positions along said resin surface.

10. A method in accordance with claim 9, wherein the rewiring is performed by means of ink-jet printing or screen printing, or electroless plating performed after formation of a seed layer pattern.

11. A method in accordance with claim 10, wherein said rewiring comprises copper particles, and reduction processing is performed by use of atomic hydrogen in order to remove oxide films of the copper particles.

12. A method in accordance with claim 10, wherein the rewiring is performed by forming a wiring pattern on the support material through electroforming together with the internal connection electrodes.

13. A method of manufacturing a semiconductor device, the method comprising:
providing a circuit element;
providing end surface electrode portions;
providing an organic substrate, said organic substrate comprising an organic substrate wiring pattern, said organic substrate comprising an organic substrate conductive layer, said organic substrate having a bottom organic substrate surface, said end surface electrode portions being arranged adjacent to said bottom organic substrate surface;
arranging said circuit element on said organic substrate and connecting said circuit element to said organic substrate wiring pattern;
providing a support comprising a conductive material;
forming internal connection electrodes on said support, said internal connection electrodes being connected to said support, each of said internal connection electrodes comprising a first end and a second end, said first end being connected to said support;
connecting said first end of each of said internal connection electrodes to said organic substrate wiring pattern, at least said circuit element, said support and said organic substrate defining a resin receiving space;
providing a resin;
disposing said resin in said resin receiving space after connecting said first ends to said organic substrate wiring pattern such that at least said circuit element is sealed with said resin, said resin having a top resin surface, said top resin surface being opposite said bottom organic substrate surface;
removing said support after filling said resin receiving space with said resin such that said internal connection electrodes are disconnected from said support, said second end of each of said internal electrodes defining an external connection electrode, each said external connection electrode being located adjacent to said top resin surface, each said external connection electrode being connected to one or more of said end surface electrode portions via said organic substrate conductive layer, said organic substrate conductive layer being connected to said organic substrate wiring pattern.

14. A method in accordance with claim 13, wherein said first end of each of said internal electrodes is connected at a different position of said wiring pattern.

15. A method in accordance with claim 13, wherein said resin engages at least said circuit element, said support, said internal connection electrodes and said organic substrate prior to said support being removed.

16. A method in accordance with claim 13, wherein said resin engages at least said circuit element, said internal connection electrodes and said organic substrate.

17. A method in accordance with claim 13, wherein rewiring is performed on said resin surface, said external connection electrodes being disposed at different positions along said resin surface.

18. A method in accordance with claim 17, wherein the rewiring is performed by means of ink-jet printing or screen printing, or electroless plating performed after formation of a seed layer pattern.

19. A method in accordance with claim 18, wherein said rewiring comprises copper particles, and reduction processing is performed by use of atomic hydrogen in order to remove oxide films of the copper particles.

20. A method in accordance with claim 19, wherein the rewiring is performed by forming a wiring pattern on the support material through electroforming together with the internal connection electrodes.

* * * * *